(12) United States Patent
Juengling

(10) Patent No.: US 9,853,027 B1
(45) Date of Patent: Dec. 26, 2017

(54) METHODS OF FORMING PATTERNS, AND APPARATUSES COMPRISING FINFETS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/391,405

(22) Filed: Dec. 27, 2016

(51) Int. Cl.
| H01L 21/027 | (2006.01) |
| H01L 21/768 | (2006.01) |
| H01L 27/088 | (2006.01) |
| H01L 21/033 | (2006.01) |
| H01L 21/8234 | (2006.01) |
| H01L 29/78 | (2006.01) |
| H01L 27/108 | (2006.01) |
| H01L 27/11507 | (2017.01) |
| H01L 27/11504 | (2017.01) |

(52) U.S. Cl.
CPC ...... H01L 27/0886 (2013.01); H01L 21/0334 (2013.01); H01L 21/823431 (2013.01); *H01L 27/10826* (2013.01); *H01L 27/10879* (2013.01); *H01L 27/11504* (2013.01); *H01L 27/11507* (2013.01); *H01L 29/7851* (2013.01); *H01L 29/7853* (2013.01)

(58) Field of Classification Search
CPC .... H01L 21/0334–21/0338; H01L 21/823431; H01L 27/0886
See application file for complete search history.

(56) References Cited

U.S. PATENT DOCUMENTS

| 8,741,758 B2 | 6/2014 | Juengling |
| 2009/0237996 A1 | 9/2009 | Kirsch et al. |
| 2011/0193157 A1 | 8/2011 | Juengling |
| 2014/0185355 A1 | 7/2014 | Juengling |
| 2014/0374809 A1* | 12/2014 | Park .................... H01L 27/1085 257/296 |

* cited by examiner

Primary Examiner — Daniel Shook
(74) Attorney, Agent, or Firm — Wells St. John P.S.

(57) ABSTRACT

Some embodiments include a method of forming a pattern. A semiconductor substrate has first and second rows extending along a first direction, and which alternate with one another along a second direction. Each of the rows includes course regions that are to be included along patterned structures. The course regions within the first rows are staggered relative to the course regions within the second rows. The patterned structures comprise first segments which extend along a third direction, and comprise second segments which extend along a fourth direction different from the third direction. Patterned masking material is formed across the substrate to define a first pattern having the first segments of the patterned structures, and to define a second pattern having the second segments of the patterned structures. The patterned structures are formed within the first and second patterns defined by the patterned masking material. Some embodiments include apparatuses having finFETs.

20 Claims, 34 Drawing Sheets

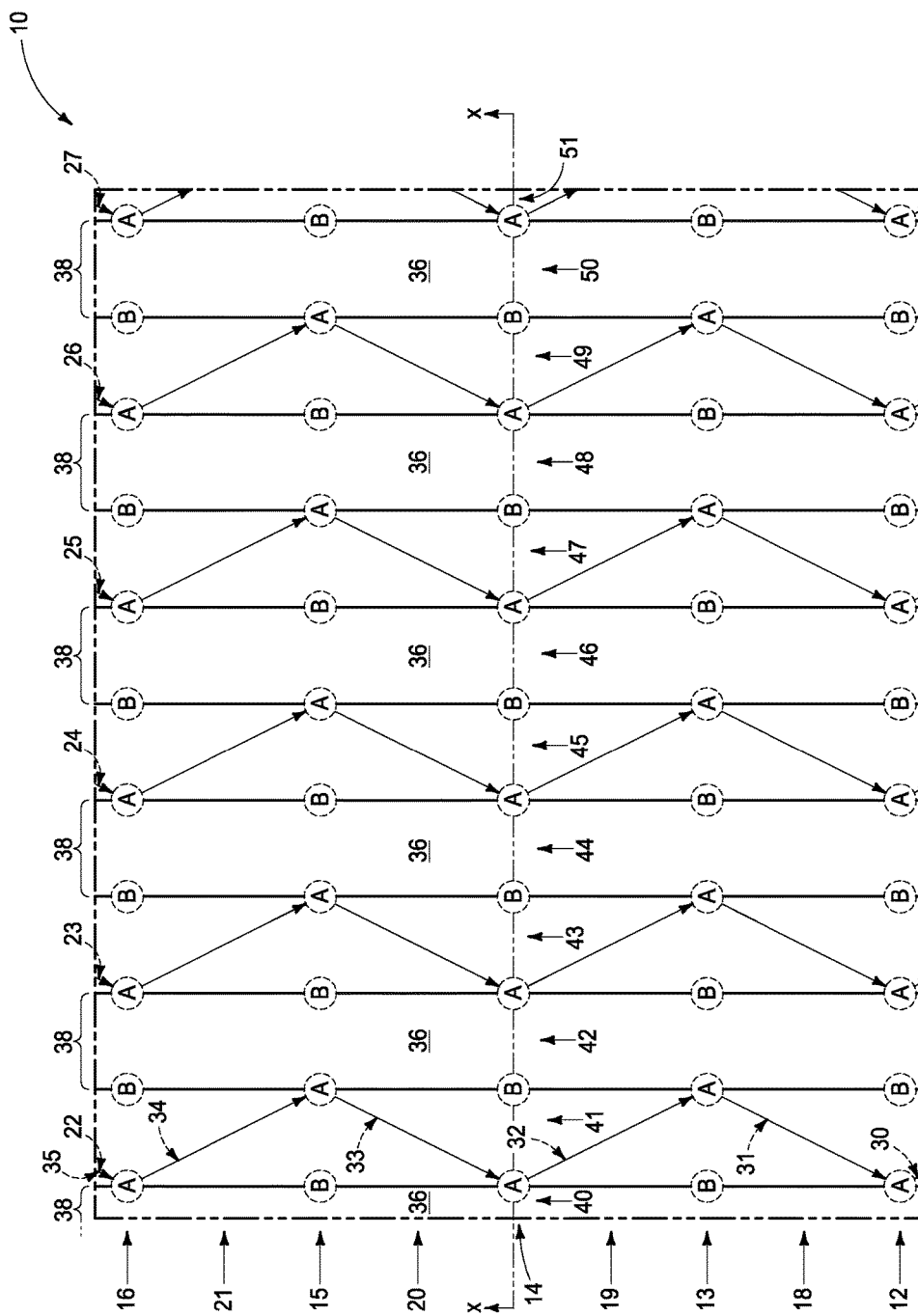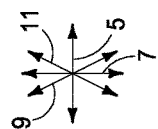
FIG. 5

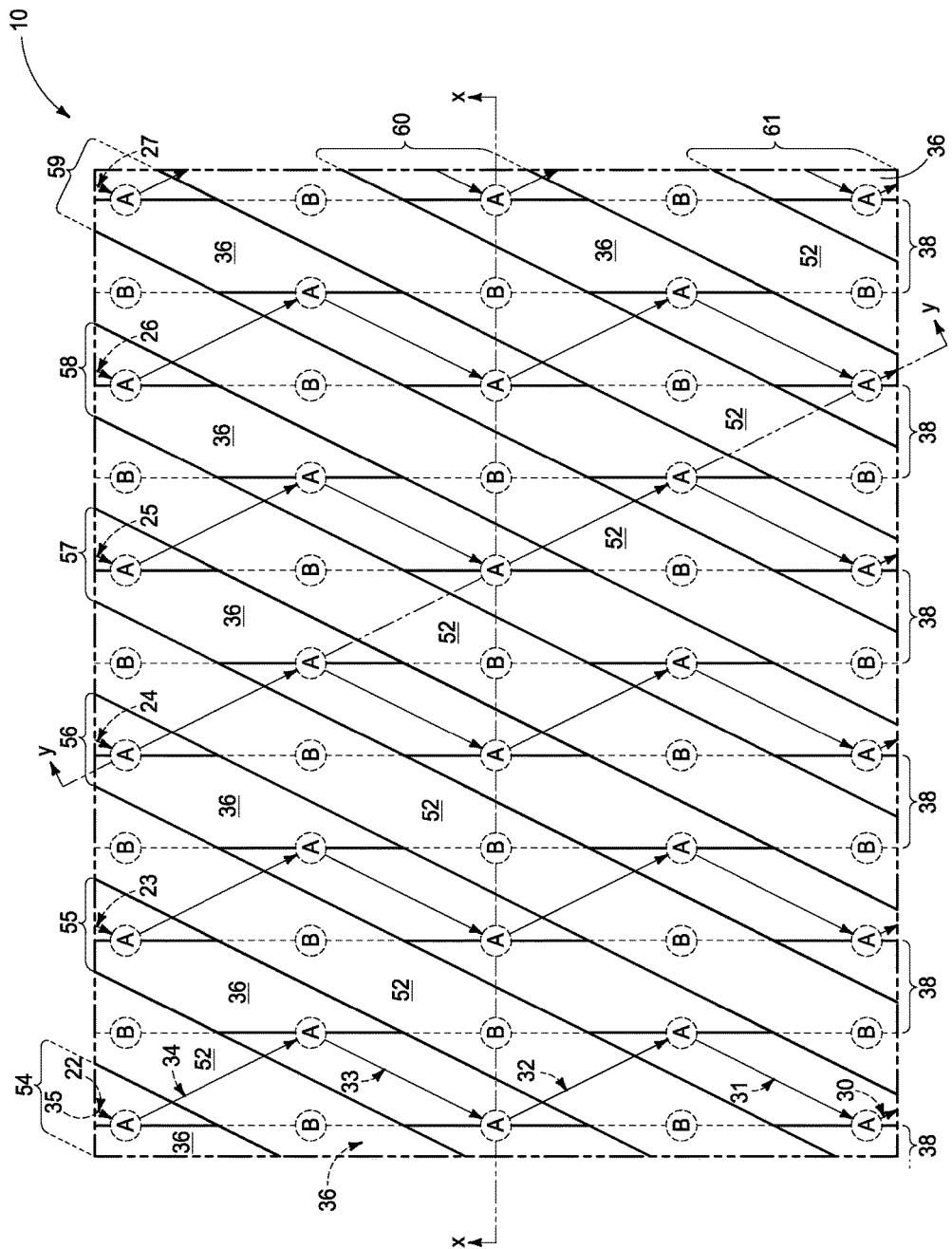
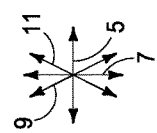
FIG. 7

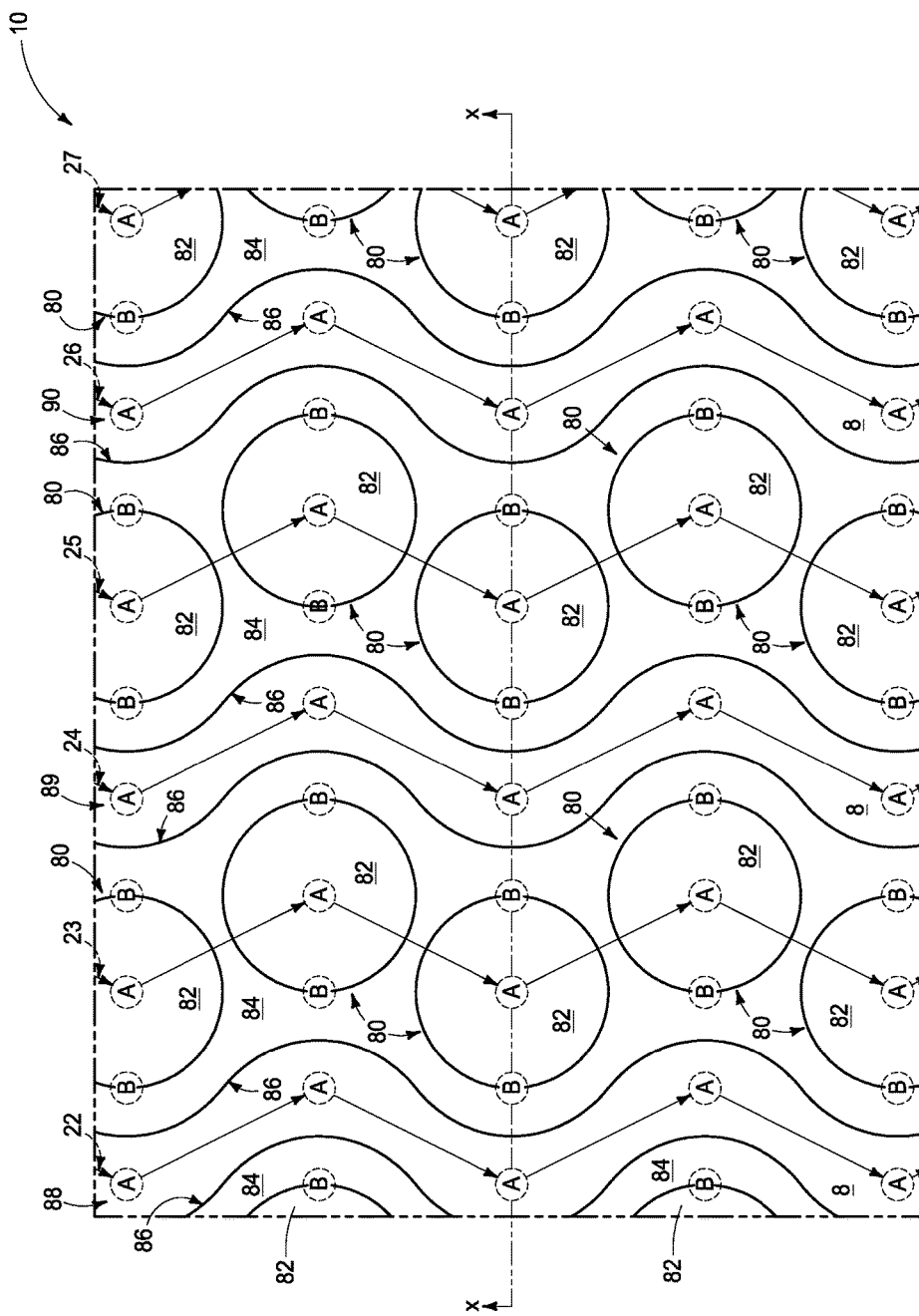
FIG. 18
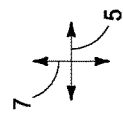

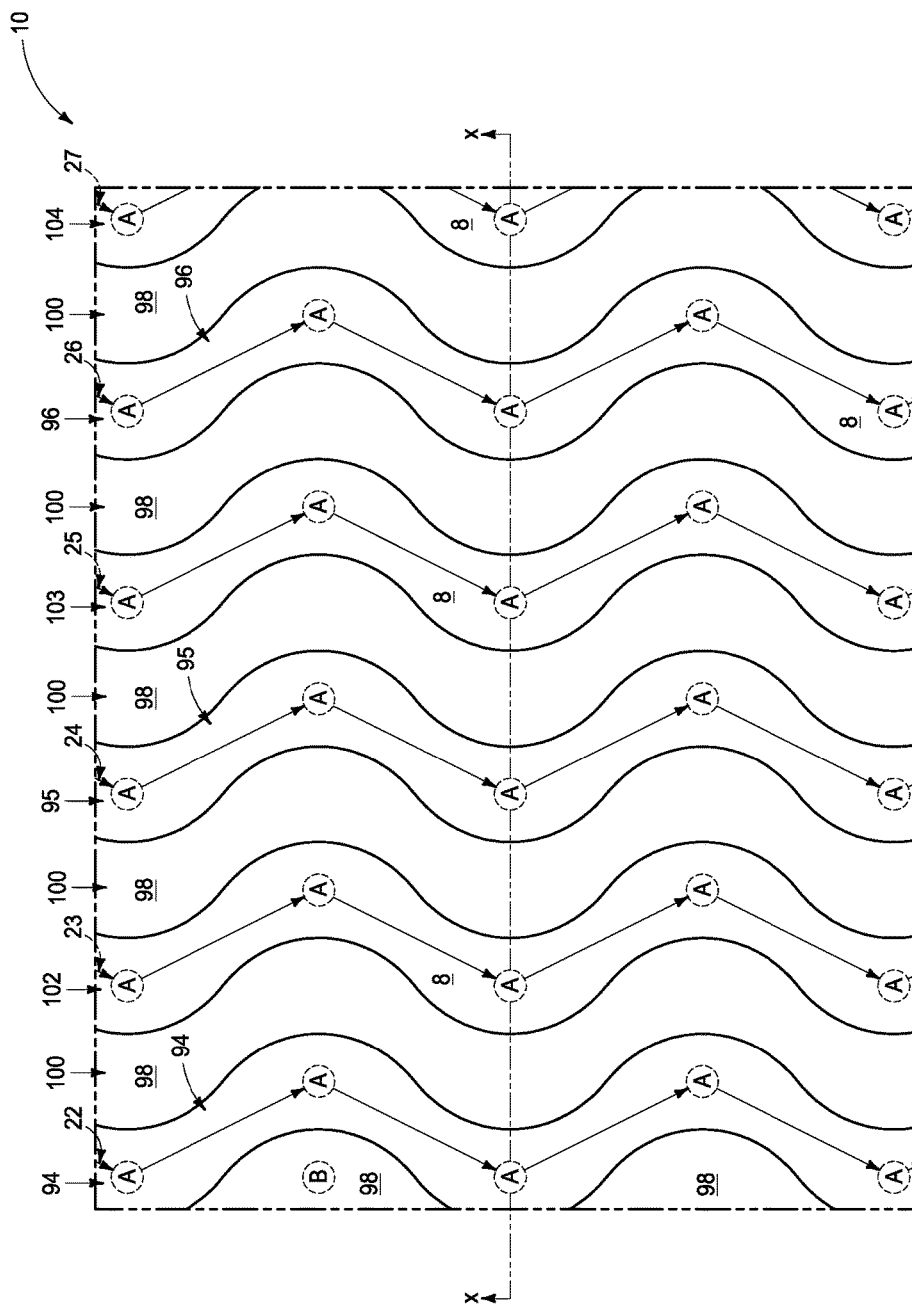
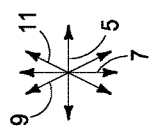
FIG. 26

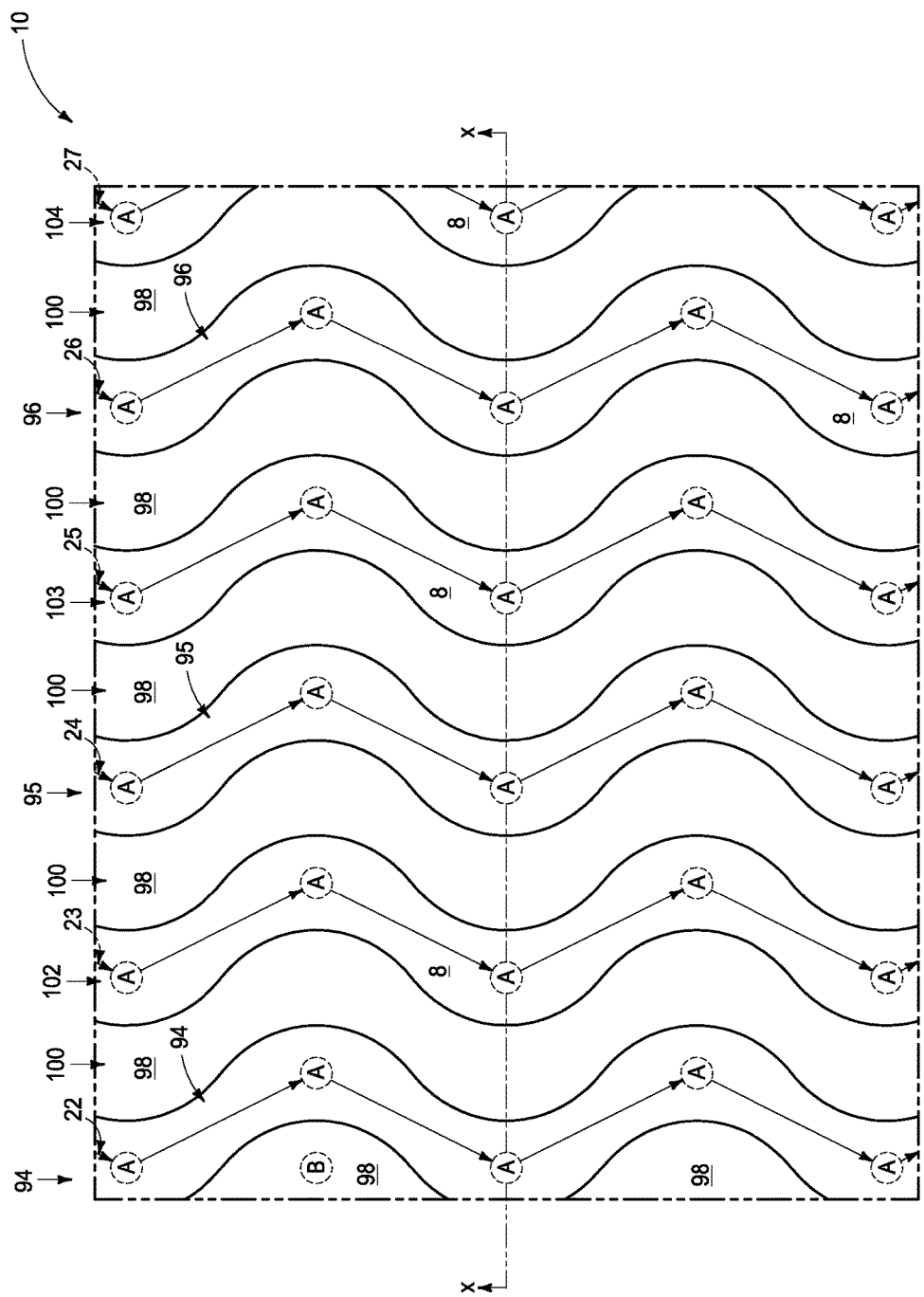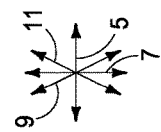
FIG. 28

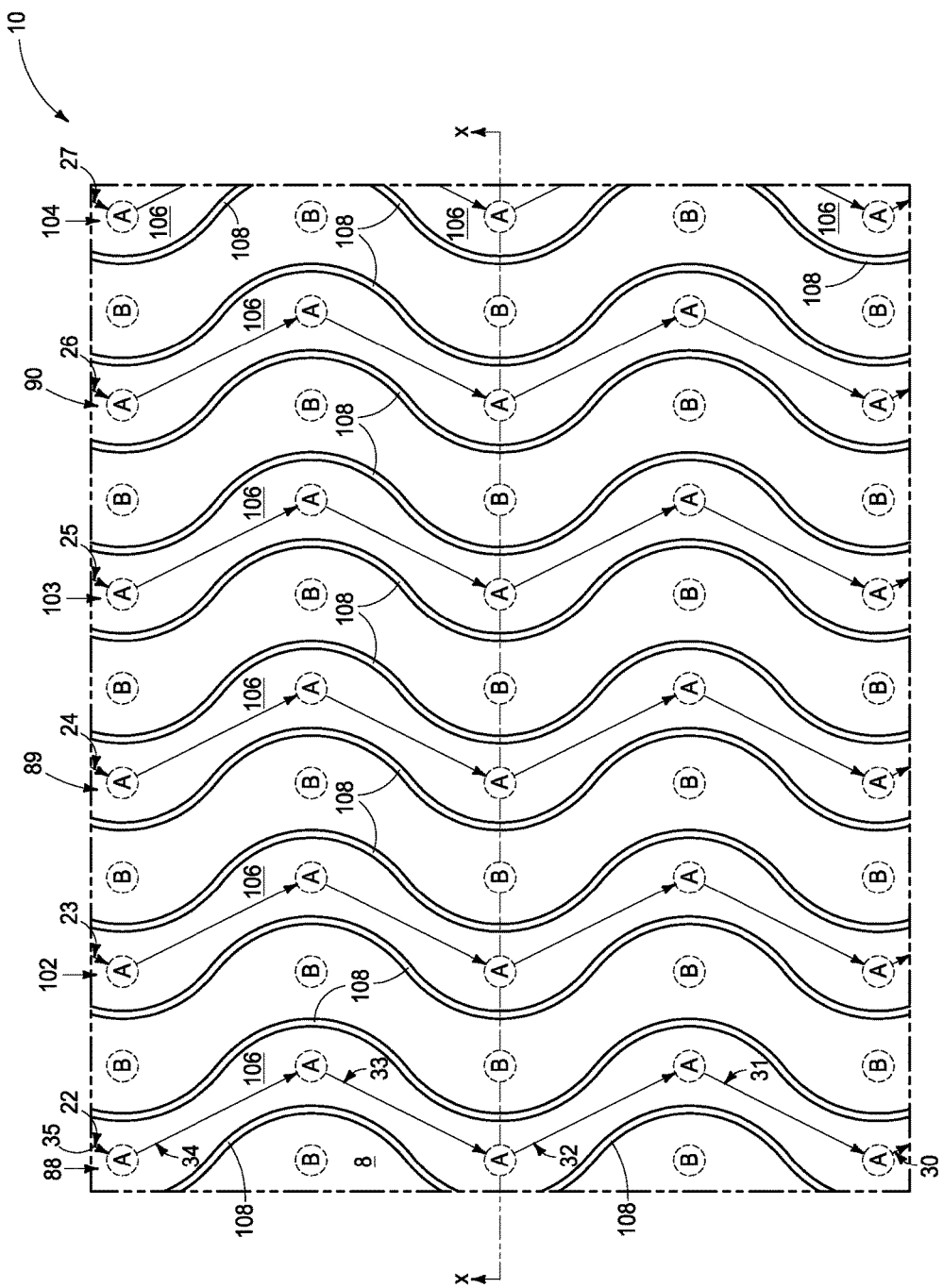
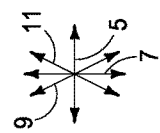
FIG. 32

METHODS OF FORMING PATTERNS, AND APPARATUSES COMPRISING FINFETS

TECHNICAL FIELD

Methods of forming patterns during integrated circuit fabrication; and apparatuses comprising finFETs.

BACKGROUND

Integrated circuit fabrication often involves formation of patterned masks across materials, followed by transfer of patterns into the materials. For instance, patterned masks may be utilized for fabrication of memory, logic, etc.

A continuing goal is to increase density of integrated circuitry. A related goal is to increase density of features within patterned masks. However, difficulties may be encountered in attempting to create uniform, dense patterns of features within masks. Accordingly, it is desired to develop new methods of forming patterned masks.

BRIEF DESCRIPTION OF THE DRAWINGS

FIGS. 5-16 are diagrammatic top views (FIGS. 5, 7, 10 and 13) and cross-sectional side views (FIGS. 6, 8, 9, 11, 12, 14, 15 and 16) of a semiconductor construction at various process stages of an example method for fabricating features analogous to those of FIGS. 2-4. The views of FIGS. 6, 8, 11 and 14 are along the lines X-X of FIGS. 5, 7, 10 and 13, respectively. The views of FIGS. 9 and 15 are along the lines Y-Y of FIGS. 7 and 13, respectively. The views of FIGS. 12 and 16 are along the lines Z-Z of FIGS. 10 and 13, respectively.

FIGS. 17-33 are diagrammatic top views (FIGS. 17, 18, 20, 22, 24, 26, 28, 30 and 32) and cross-sectional side views (FIGS. 19, 21, 23, 25, 27, 29, 31 and 33) of a semiconductor construction at various process stages of an example method for fabricating features analogous to those of FIGS. 2-4. The views of FIGS. 19, 21, 23, 25, 27, 29, 31 and 33 are along the lines X-X of FIGS. 18, 20, 22, 24, 26, 28, 30 and 32, respectively.

DETAILED DESCRIPTION OF THE ILLUSTRATED EMBODIMENTS

Some embodiments include methods of forming structures which extend in a zigzag manner across a semiconductor substrate, and/or which extend in a curvilinear manner across the substrate. In some embodiments the structures may correspond to digit lines extending across columns of a memory array. Example embodiments described with reference to FIGS. 1-34.

Figure 1:
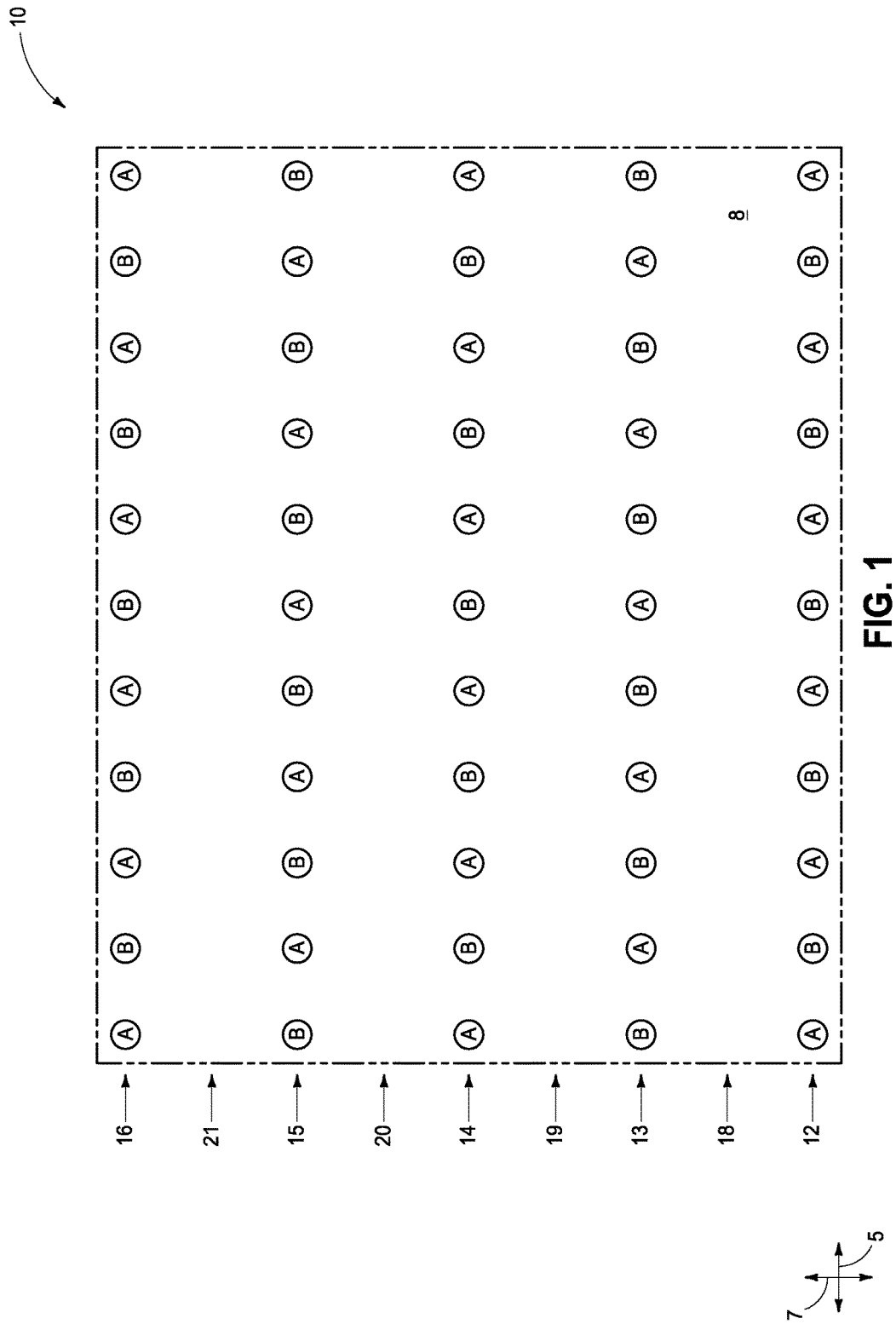
FIG. 1 is a diagrammatic top view of a region of a semiconductor substrate illustrating example locations for defining integrated circuit structures.

Referring to FIG. 1, an example semiconductor construction 10 comprises rows 12-16 extending across a semiconductor substrate 8. Each row comprises integrated circuit components "A" and "B". In some embodiments the integrated circuit components "A" and "B" may be comprised by a memory array. In such embodiments the integrated circuit components "A" may correspond to digit line contacts, and the integrated circuit components "B" may correspond to data storage units (for instance, capacitors of dynamic random access memory [DRAM], ferroelectric capacitors of ferroelectric memory, etc.), or to contacts which ultimately connect with data storage units.

The integrated circuit components "A" and "B" alternate with one another along the rows 12-16. In the illustrated embodiment the rows 12-16 are subdivided amongst first rows corresponding to rows 12, 14 and 16; and second rows corresponding to rows 13 and 15. The integrated circuit components "A" and "B" are staggered in the first rows set (i.e., rows 12, 14 and 16) relative to the second rows (i.e., rows 13 and 15).

The rows 12-16 extend along a first direction corresponding to an axis 5. The first rows (i.e., rows 12, 14 and 16) alternate with the second rows (i.e., rows 13 and 15) along a second direction corresponding to an axis 7. The rows 12-16 are spaced one another by gaps 18-21 between the rows.

The semiconductor substrate 8 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the semiconductor substrate 8 may contain one or more materials associated with integrated circuit fabrication. Such materials may include, for example, one or more of refractory metal materials, barrier materials, diffusion materials, insulator materials, etc.

The integrated circuit components "A" and "B" may be spaced from one another by insulative material associated with the semiconductor substrate 8.

Figure 2:
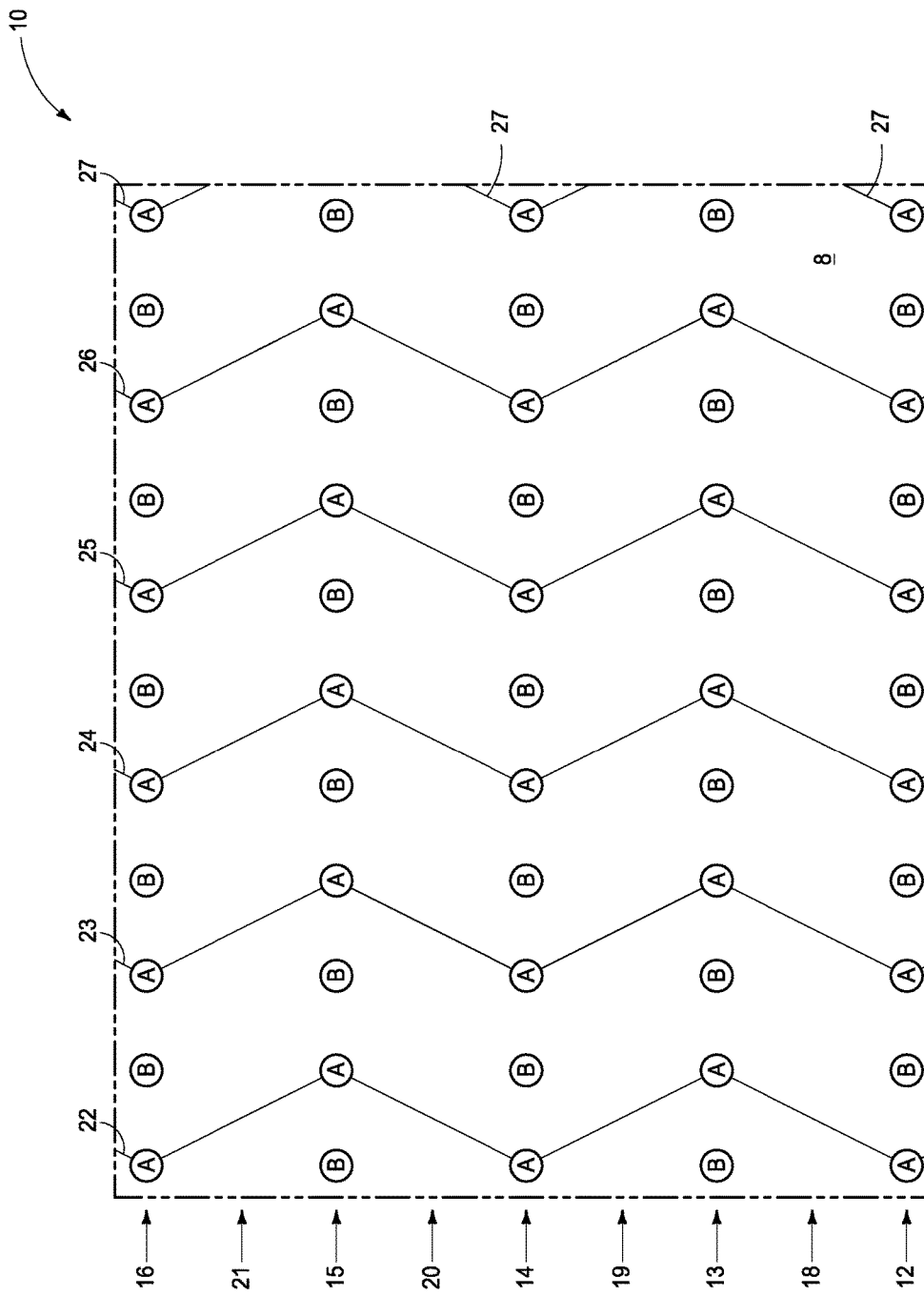
FIG. 2 is a diagrammatic top view of the region of the semiconductor substrate of FIG. 1 illustrating example integrated circuit structures.

Referring to FIG. 2, integrated circuit structures 22-27 are formed to integrated circuit components "A" along the second direction (i.e., the direction of axis 7). The structures 22-27 may correspond to digit lines extending along columns of a memory array, or to other wiring. Each of the structures 22-27 has a zigzag pattern due to the staggered arrangement of the components "A" within rows 12-16.

The staggered arrangement of components "A" may be desired to achieve tight packing, and associated high integration. However, it is difficult to form the structures 22-27 with the illustrated zigzag pattern. Accordingly, it is desired to develop methods suitable for fabricating the structures 22-27.

Figure 3:
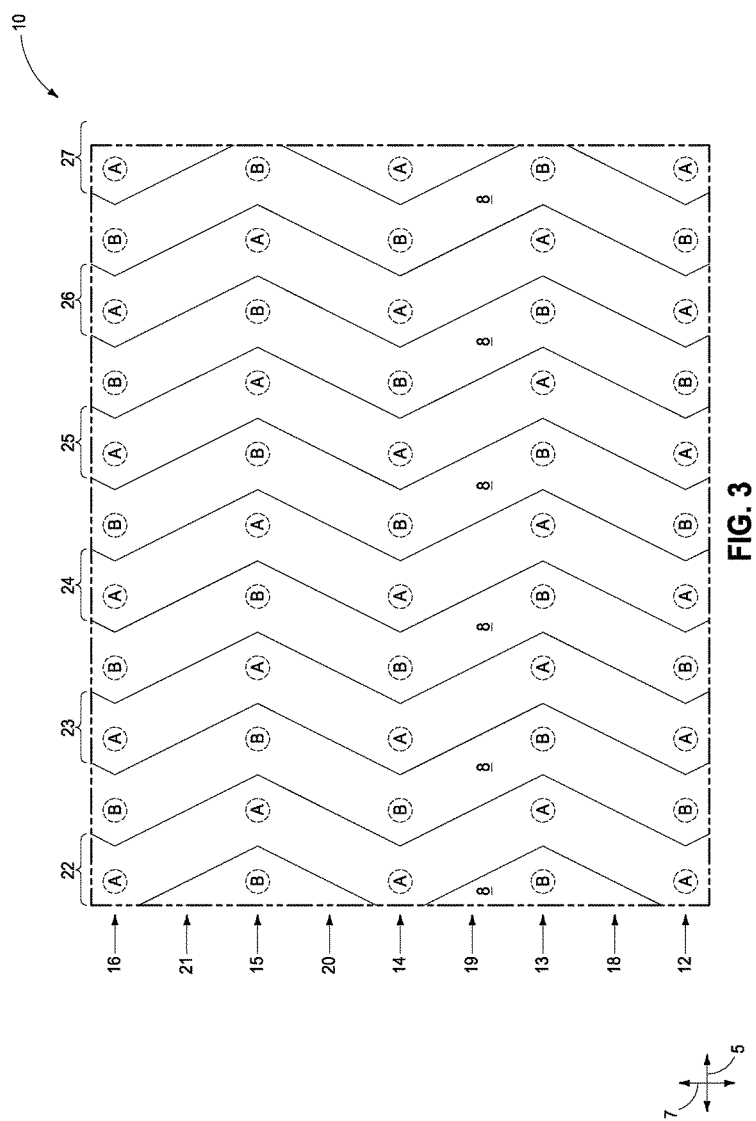
FIG. 3 is a diagrammatic top view of the region of the semiconductor substrate of FIG. 2 further illustrating the example integrated circuit structures.

FIG. 3 illustrates structures 22-27 in an alternative view. Specifically, the structures 22-27 are shown to have width dimensions. Also, FIG. 3 replaces the components "A" and "B" with regions "A" and "B" (as indicated by dashed-lines around "A" and "B"). Such regions may correspond to locations where the components "A" and "B" are either already formed, or desired to be formed. In some embodiments the regions "A" may be referred to as course regions which are included along the structures 22-27.

FIG. 3 shows the structures 22-27 separated from one another by regions of semiconductor substrate 8. In some embodiments such regions may comprise, consist essentially of, or consist of insulative material (e.g., one or more of silicon dioxide, silicon nitride, etc.).

Figure 4:
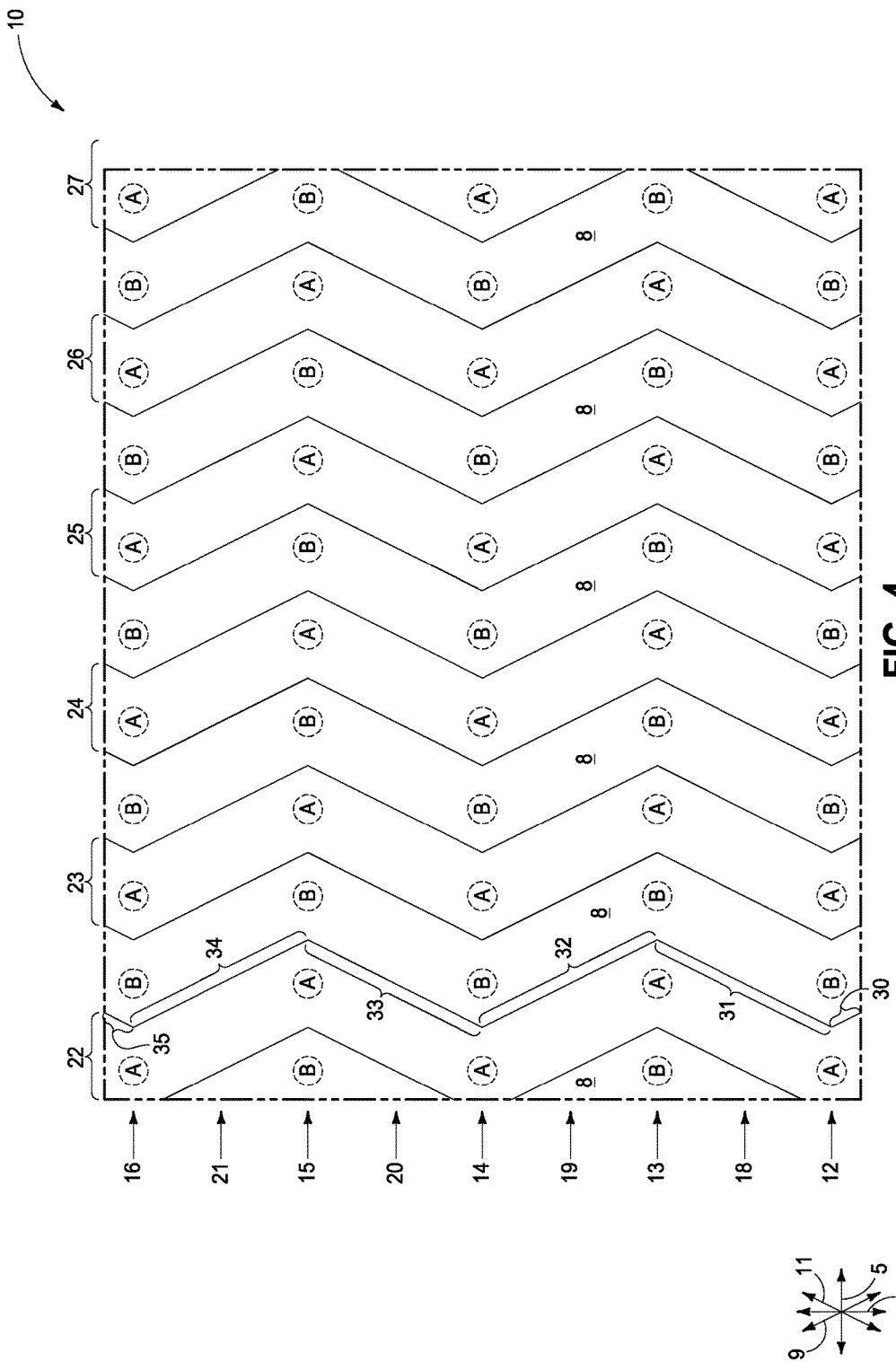
FIG. 4 is a diagrammatic top view of the region of the semiconductor substrate of FIG. 3 illustrating features of the example integrated circuit structures.

One method of patterning structures 22-27 involves fabrication of some segments of the structures 22-27, followed by fabrication of other segments of the structures 22-27. For instance, FIG. 4 shows that the structure 22 may be considered to comprise a plurality of segments 30-35 which together define the zigzag pattern of the structure 22. The segments 30, 32 and 34 extend along a third direction corresponding to an axis 9, and may be referred to as first segments. The segments 31, 33 and 35 extend along a fourth direction corresponding to an axis 11, and may be referred to as second segments.

The third and fourth axes 9 and 11 are between the first and second axes 5 and 7. The structures 23-27 have segments analogous to those of the structure 22, although such are not labeled in FIG. 4 in order to simplify the drawing.

Some embodiments utilize a first fabrication sequence to form the conductive material of either the first segments (i.e., 30, 32 and 34) or second segments (i.e., 31, 33 and 35) of structures 22-27, and then utilize a second fabrication sequence to form the conductive material of the other of the first segments (i.e., 30, 32 and 34) and second segments (i.e., 31, 33 and 35) of structures 22-27. An example of such embodiments is described with reference to FIGS. 5-16.

Figure 6:
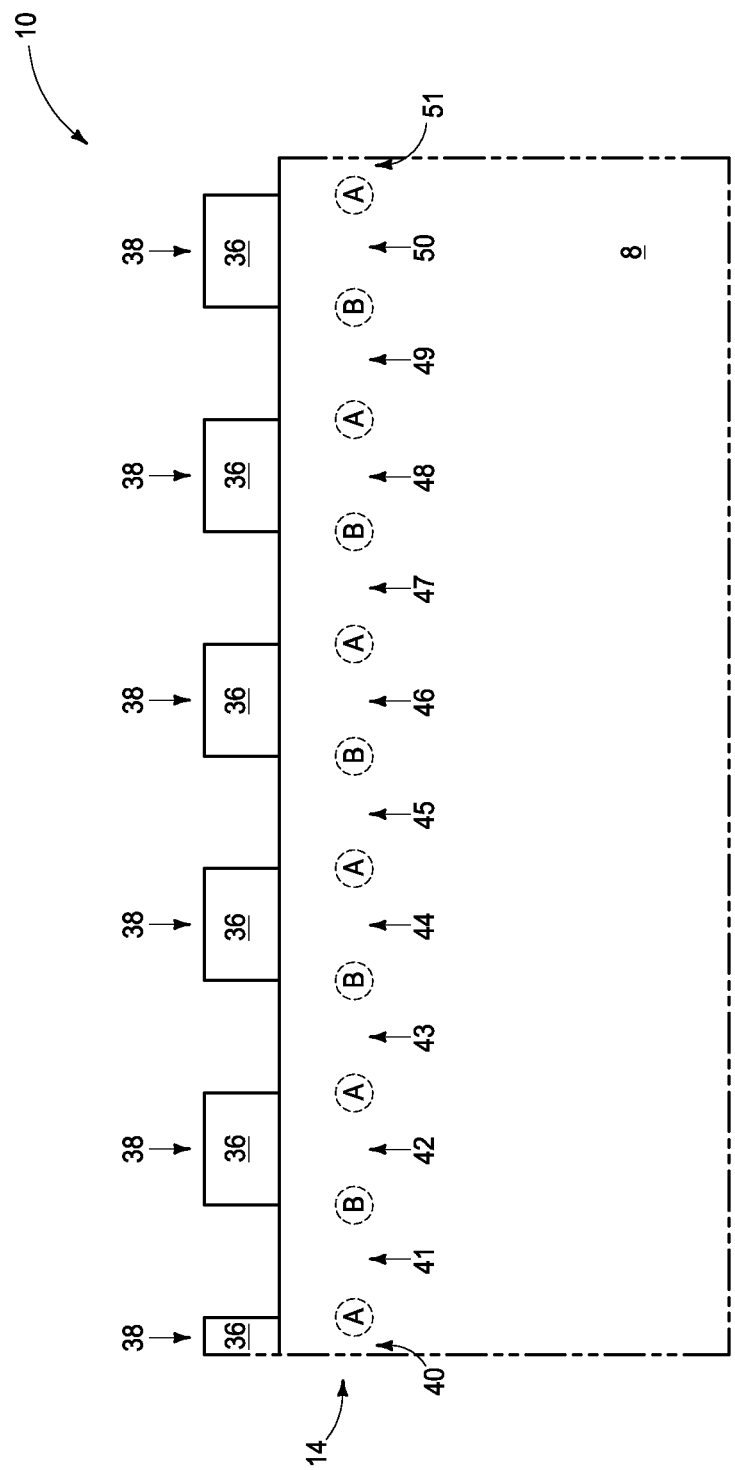

Referring to FIGS. 5 and 6 (with FIG. 6 being a view along the line X-X of FIG. 5), the regions "A" and "B" may be considered to be first and second regions, respectively; with the regions "A" being the course regions that are eventually to be included along patterned structures. The regions "A" and "B" alternate with one another along the rows 12-16. Spaces 40-51 are between the alternating regions "A" and "B" (with the spaces 40-51 being shown along the row 14).

Blocking material 36 is formed in segments 38 across construction 10. The segments 38 are strips extending along the second direction of axis 7. The segments 38 are across every other space (i.e., are across spaces 40, 42, 44, 46, 48 and 50) between the first and second regions "A" and "B" along the rows 12-16.

The blocking material 36 may comprise any suitable composition; including, for example, one or more of photoresist, silicon dioxide, silicon nitride, etc.

Locations of structures 22-27 are diagrammatically illustrated in FIG. 5 with arrows. Notably, the structures 22-27 will ultimately be formed in gaps between the strips 38 of blocking material 36. The segments 30-35 are illustrated relative to structure 22 to assist in describing the embodiments that follow.

Figure 8:
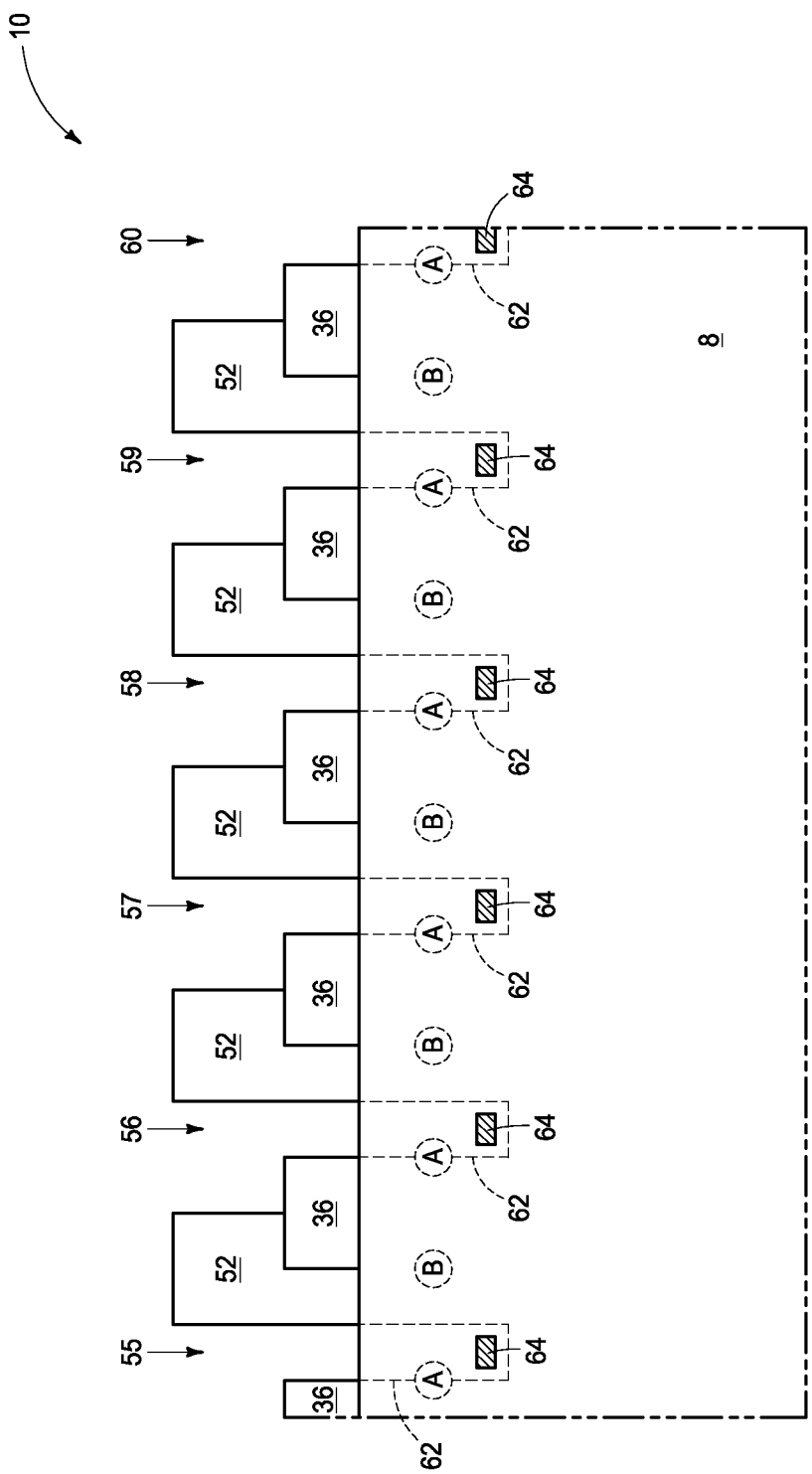
Figure 9:
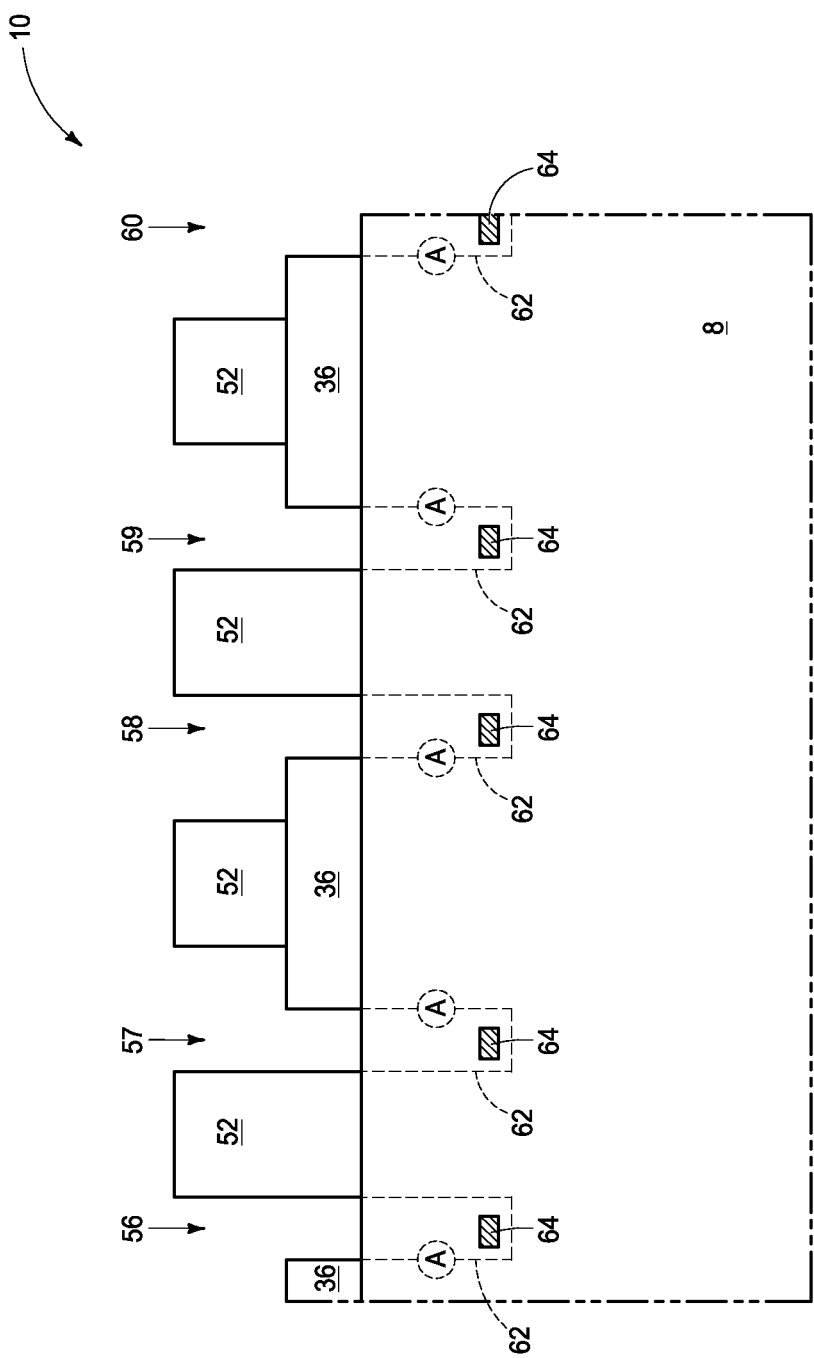

Referring to FIGS. 7-9 (with FIG. 8 being a view along the line X-X of FIG. 7, and FIG. 9 being a view along the line Y-Y of FIG. 7), masking material 52 is formed over an upper surface of construction 10, and is patterned to have a plurality of trenches 54-61 extending therethrough. The trenches 54-61 extend along the direction of axis 11, and accordingly may be utilized to pattern the segments 31, 33 and 35 of structures 22-27. The trenches 54-61 are substantially linear; with the term "substantially linear" meaning linear to within reasonable tolerances of fabrication and measurement.

FIGS. 8 and 9 show that the trenches 54-61 extend to an upper surface of semiconductor substrate 8 (with only some of the trenches 54-61 being visible in the cross-sections of FIGS. 8 and 9), and overlap portions of the course regions "A". The trenches 54-61 may be utilized to form patterned regions 62 within semiconductor substrate 8. Such patterned regions may be utilized to pattern a conductive material 64 into the segments 31, 33 and 35 of structures 22-27. The conductive material 64 may comprise any suitable composition or combination of compositions; and in some embodiments may comprise, consist essentially of, or consist of one or more metals (for instance, copper), metal-containing compositions (for instance, metal nitrides, metal silicides, alloys of two or more metals, etc.) and/or conductively-doped semiconductor materials (for instance, conductively-doped silicon, conductively-doped germanium, etc.). For instance, in some embodiments the semiconductor substrate 8 may comprise semiconductor material at the bottoms of trenches 54-61, and may comprise insulative material alongside such semiconductor material (see, for example, an example structure of FIG. 34). In such embodiments, the conductive material 64 may correspond to conductively-doped regions formed within the semiconductor material, with such conductively-doped regions being patterned utilizing trenches 54-61. In other example embodiments, the semiconductor substrate 8 may comprise an insulative composition at the bottoms of trenches 54-61. The trenches 54-61 may be extended into the insulative composition, and then conductive material 64 may be formed within the trenches to form the segments 31, 33 and 35 of structures 22-27. In such embodiments, the conductive material 64 may comprise metal, metal-containing compositions, and/or conductively-doped semiconductor.

Figure 10:
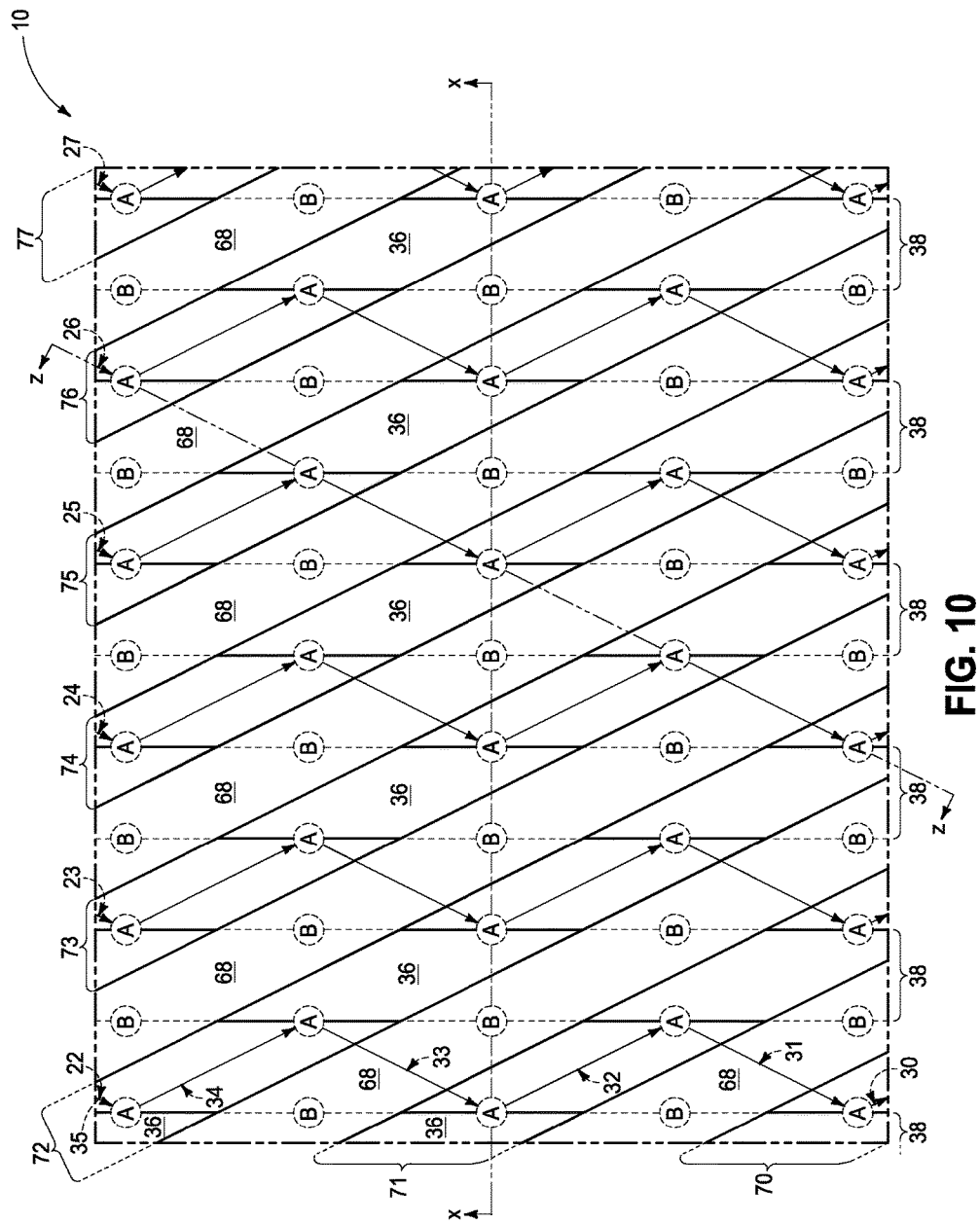
Figure 11:
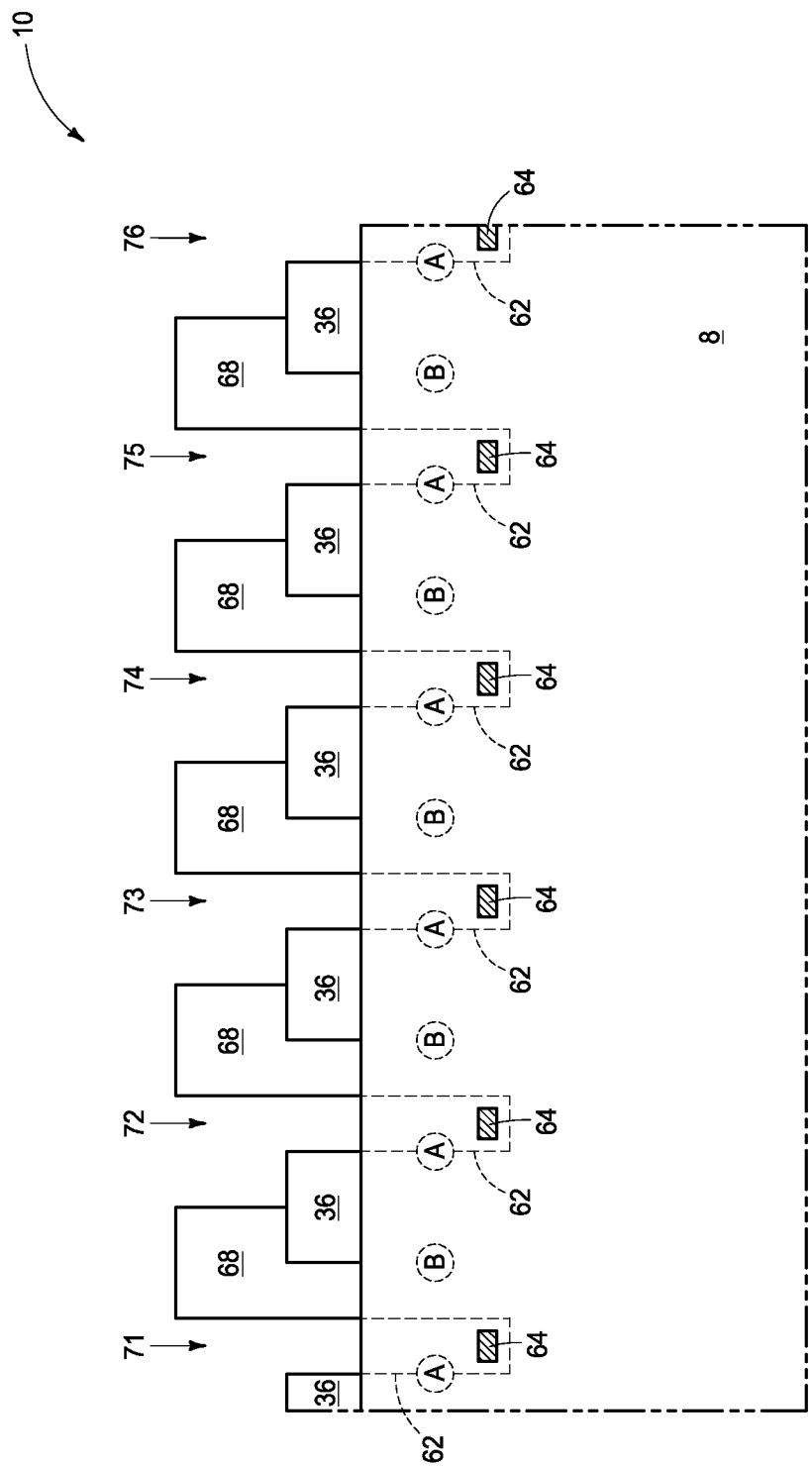
Figure 12:
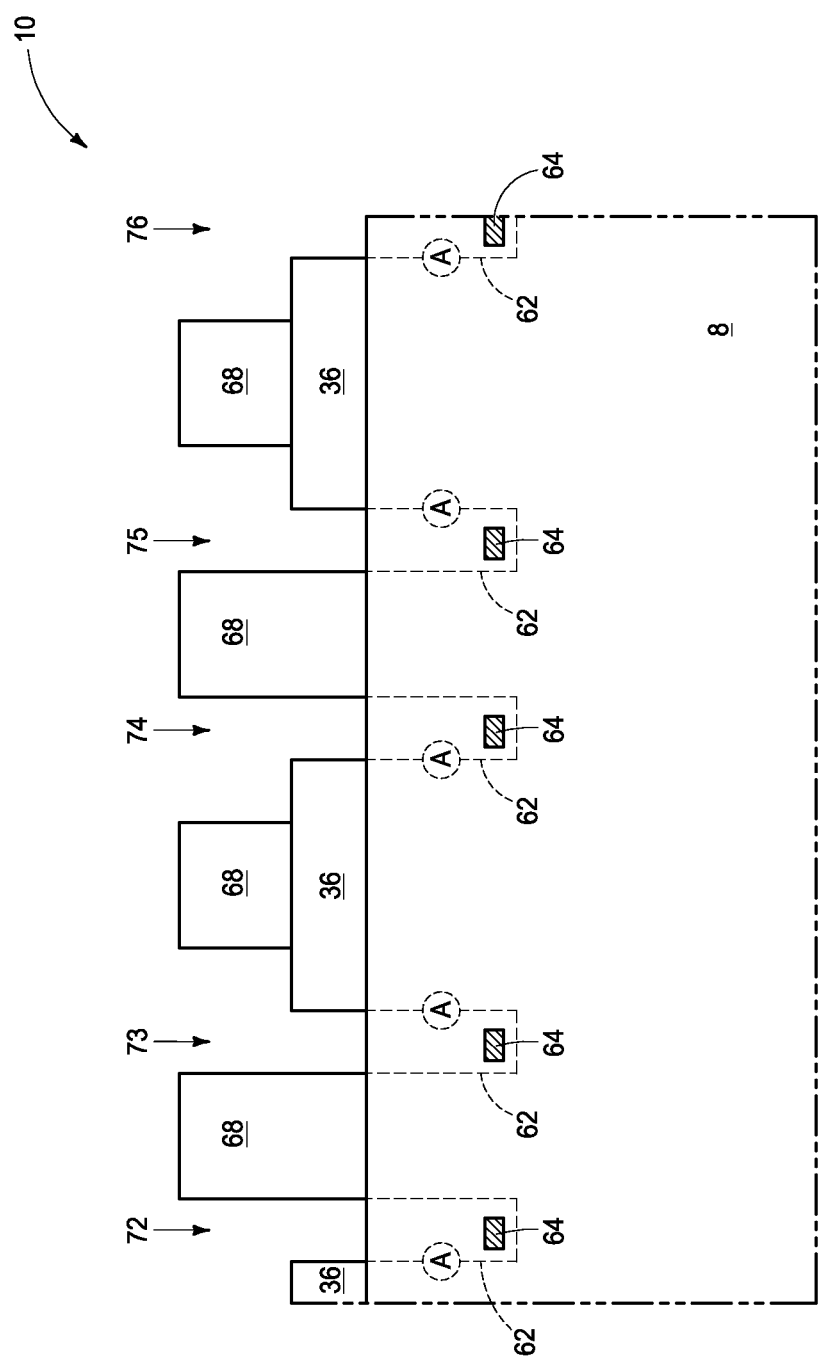
Figure 13:
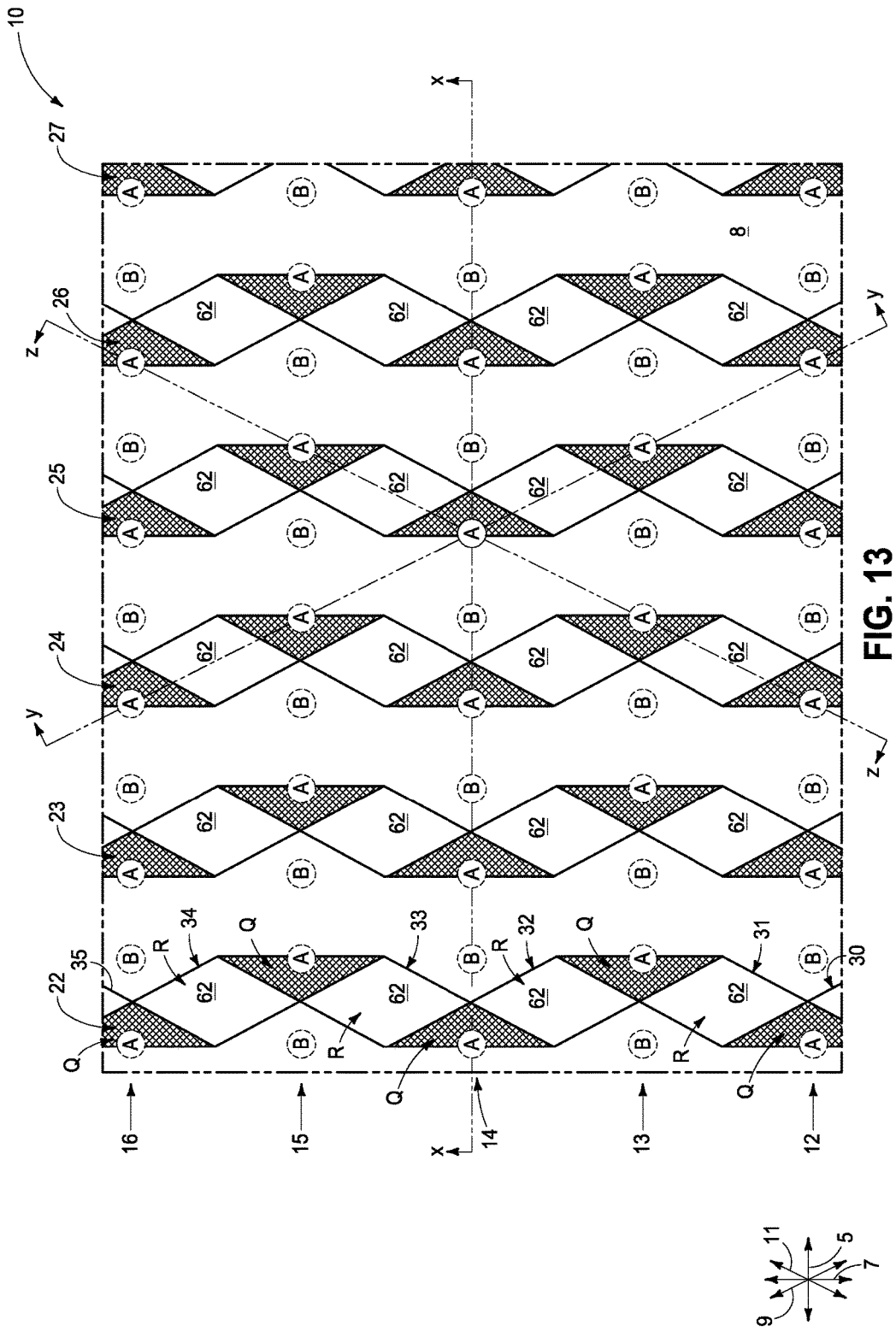

Referring to FIGS. 10-12 (with FIG. 11 being a view along the line X-X of FIG. 10, and FIG. 12 being a view along the line Z-Z of FIG. 10), masking material 68 is formed over an upper surface of construction 10, and is patterned to have a plurality of trenches 70-77 extending therethrough. The trenches 70-77 extend along the direction of axis 9, and accordingly may be utilized to pattern the segments 30, 32 and 34 of structures 22-27. The trenches 70-77 are substantially linear. The masking material 52 of FIGS. 7-9 may or may not be present at the processing stage of FIGS. 10-12; depending on whether the masking material 52 is removed and/or if the processing stage of FIGS. 10-12 is performed prior to that of FIGS. 7-9 (as discussed in more detail below). The masking material 52 is not illustrated in FIGS. 10-12 in order to simplify the drawings.

FIGS. 11 and 12 show that the trenches 70-77 extend to an upper surface of semiconductor substrate 8 (like the trenches 54-61 of FIGS. 8 and 9), and overlap the course regions "A" (with only some of the trenches 70-77 being visible in the cross-sections of FIGS. 11 and 12). The trenches 70-77 may be utilized to form patterned regions 62 of the type described above with reference to FIGS. 8 and 9; and conductive material 64 may be provided within such patterned regions to form the segments 30, 32 and 34 of structures 22-27.

The processing of FIGS. 10-12 may follow that of FIGS. 7-9 (as shown), or may be prior to that of FIGS. 7-9. Accordingly, in some embodiments the trenches 54-61 (FIGS. 7-9) may be first trenches while the trenches 70-77 (FIGS. 10-12) are second trenches; and in other embodiments the trenches 70-77 (FIGS. 10-12) may be first trenches while the trenches 54-61 (FIGS. 7-9) are second trenches. Notably, the masking material utilized to pattern the second trenches may be formed over the masking material utilized to pattern the first trenches (i.e., may pass across the masking material utilized to pattern the first trenches) in some embodiments.

Referring to FIGS. 13-16 (with FIG. 14 being a view along the line X-X of FIG. 13, FIG. 15 being a view along the line Y-Y of FIG. 13, and FIG. 16 being a view along the line Z-Z of FIG. 13), construction 10 is subjected to planarization (for instance, chemical mechanical polishing) to form the planarized upper surface 78. The conductive structures 22-27 are now complete. In the illustrated embodiment the structures are conductive lines extending in a zigzag pattern across the rows 12-17. The conductive lines of patterned structures 22-27 may be utilized in any suitable application. For instance, in some applications the conductive lines may be digit lines of a memory array. Such memory array may be a DRAM array, an array comprising ferroelectric memory, etc. In other embodiments the structures 22-27 may be semiconductor material lines, insulative lines, etc.

Figure 14:
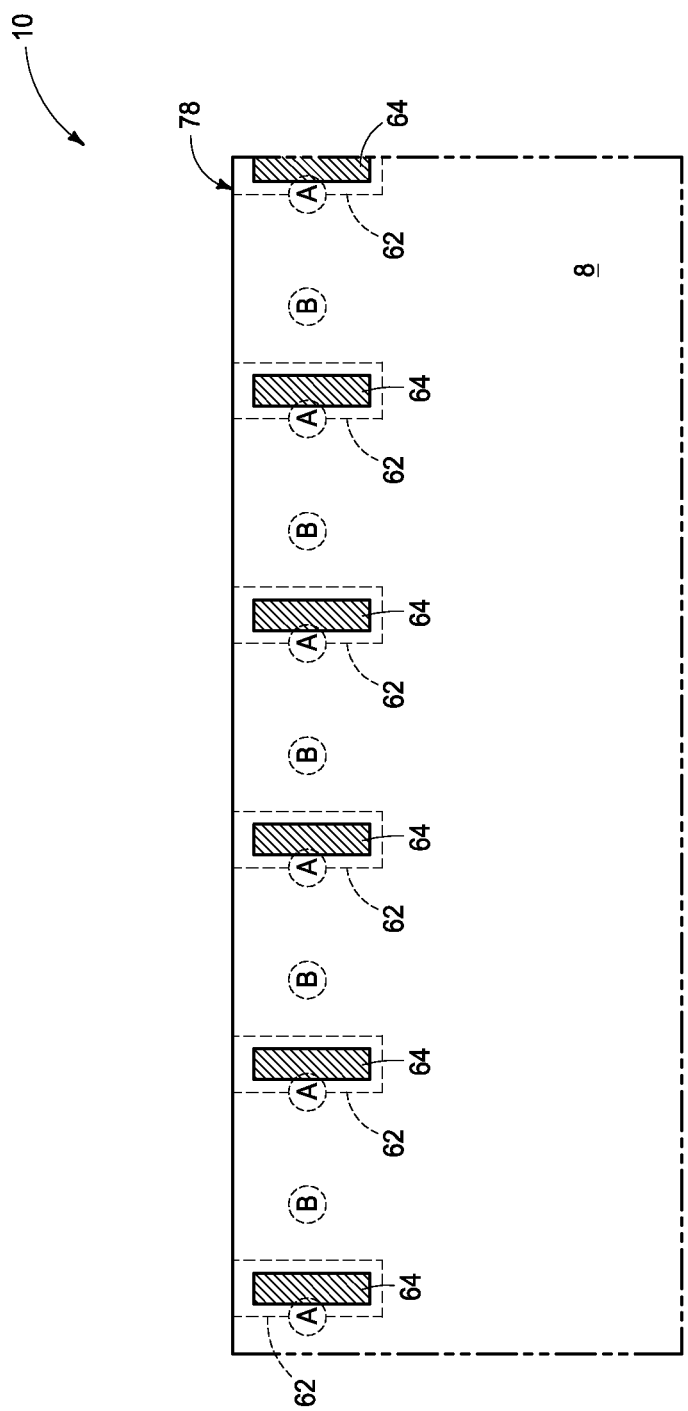
Figure 15:
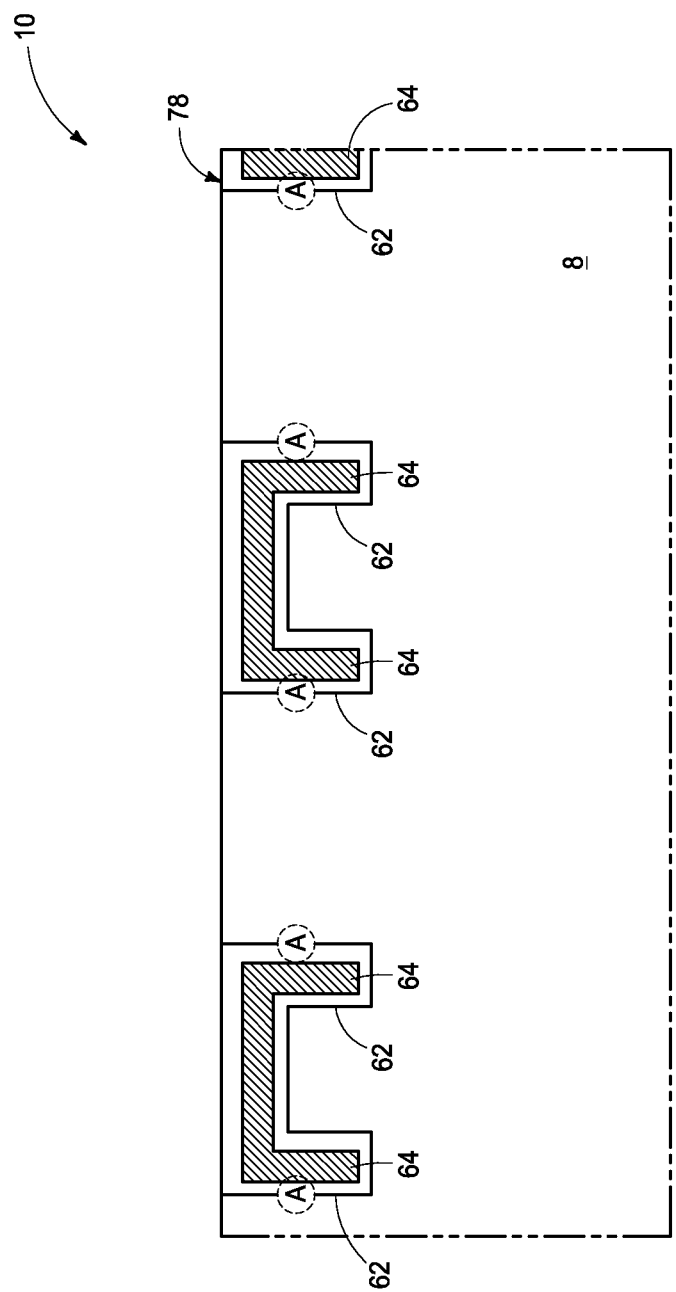
Figure 16:
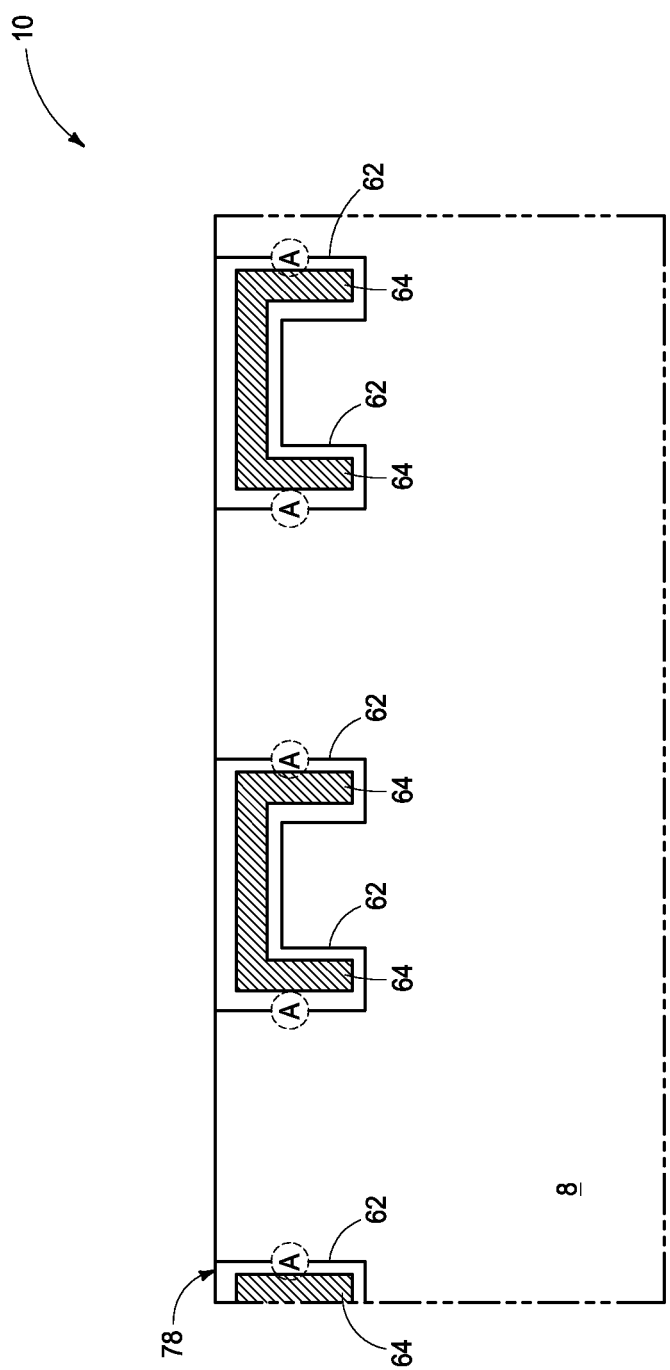

The regions 62 and material 64 of FIGS. 8-12 are placeholders, indicating locations of final regions 62 and material 64 but not necessarily indicating final shapes of the regions 62 and conductive material 64. In the embodiment of FIGS. 13-16, some portions of regions 62 are about twice as deep as other portions, due to some portions being etched at both the processing stage of FIGS. 7-9 and the processing stage of FIGS. 10-12, and other portions of regions 62 being etched at only the processing stage of FIGS. 7-9 or only the processing stage of FIGS. 10-12. The deep portions of regions 62 are illustrated relative to the structures 22-27 of FIG. 13 as hatched regions (labeled "Q" relative to structure 22), and the less deep portions of regions 62 are illustrated as unhatched regions (labeled "R" relative to structure 22). The views of FIGS. 14-16 show the conductive material 64 being thicker in the deeper portions of regions 62 and thinner in the less deep portions of regions 62. The thin portions of material 64 extend from top regions of the thick portions of material 64. The illustrated configurations are example configurations, and numerous other configurations may be formed with the processing described herein. For instance, in some embodiments material 64 may have a common thickness across the deep and less deep portions of regions 62; in some embodiments the conductive material 64 of structures 22-27 may be formed over substrate 8, rather than extending into substrate 8; etc.

The embodiment of FIGS. 5-16 utilizes numerous masking steps to pattern the structures 22-27. In some embodiments it is desired to reduce the number of masking steps in order to reduce costs and/or reduce risk of mask misalignment. FIGS. 17-32 describe an alternative process for forming structures of the type illustrated as structures 22-27 of FIG. 3 with reduced masking steps as compared to the embodiment of FIGS. 5-16.

Figure 17:
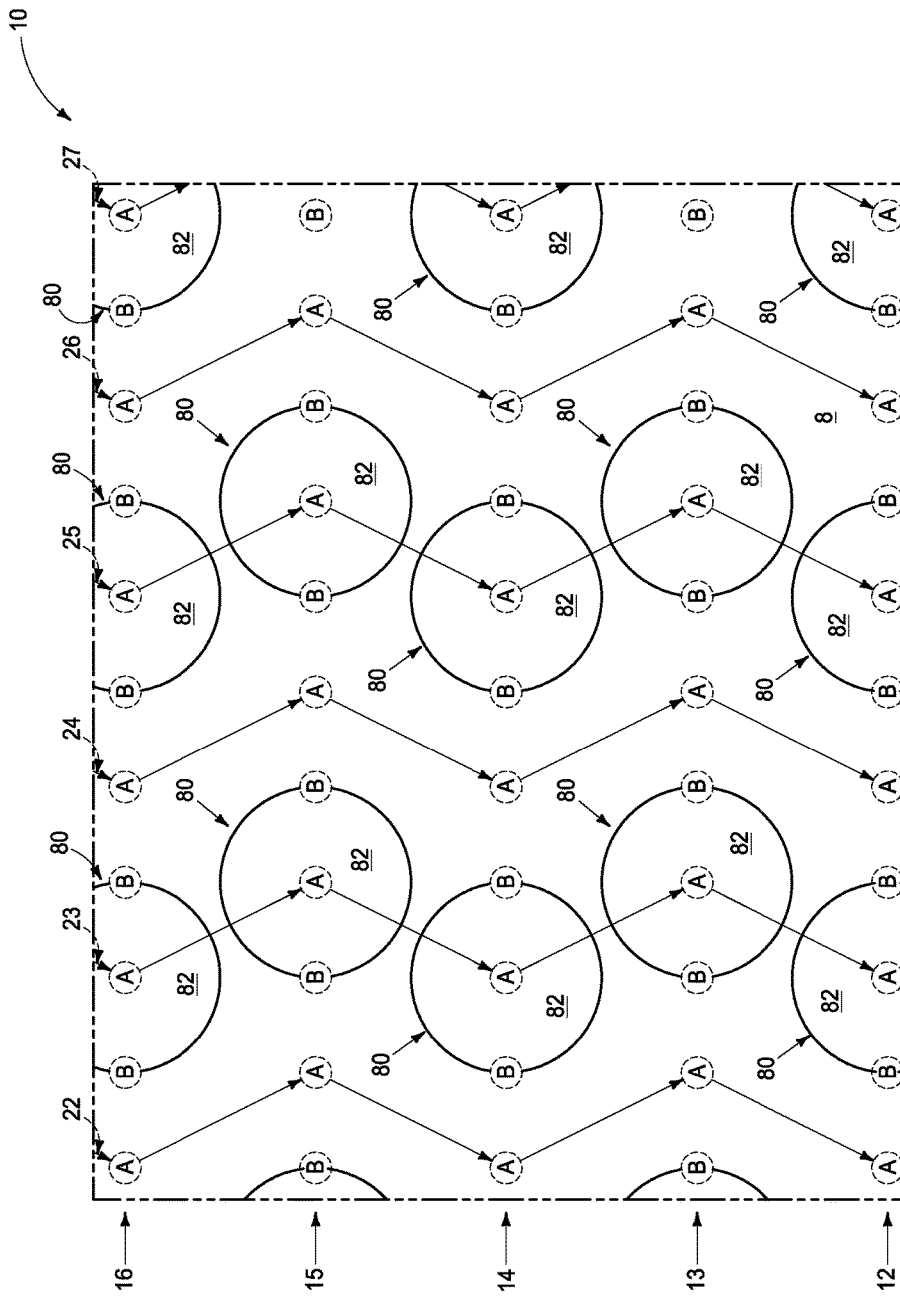

Referring to FIG. 17, islands 80 of masking material 82 are formed over alternating course regions "A" along the rows 12-16. The islands 80 may have any suitable size and shape. In the shown embodiment the islands 80 have substantially circular outer lateral peripheries; with the term "substantially circular" meaning circular to within reasonable tolerances of fabrication and measurement. The outer lateral peripheries of the islands 80 are shown extending over the regions "B" adjacent the course regions "A". In other embodiments the islands 80 may be smaller than those illustrated; and in yet other embodiments the islands 80 may be larger than those illustrated.

The material 82 of islands 80 may comprise any suitable composition or combination of compositions; including, for example, one or more of photoresist, silicon nitride, silicon oxide, etc. In some embodiments it may be advantageous to form the islands from photoresist in that it can be relatively simple to pattern photoresist into the illustrated island configuration.

The desired locations of patterned structures 22-27 are diagrammatically illustrated in FIG. 17 with arrows. Note that every other one of the patterned structure locations is covered by the islands 80 of masking material 82 (specifically, the locations of patterned structures 23, 25 and 27 are covered by the islands 80 of masking material 82).

Figure 19:
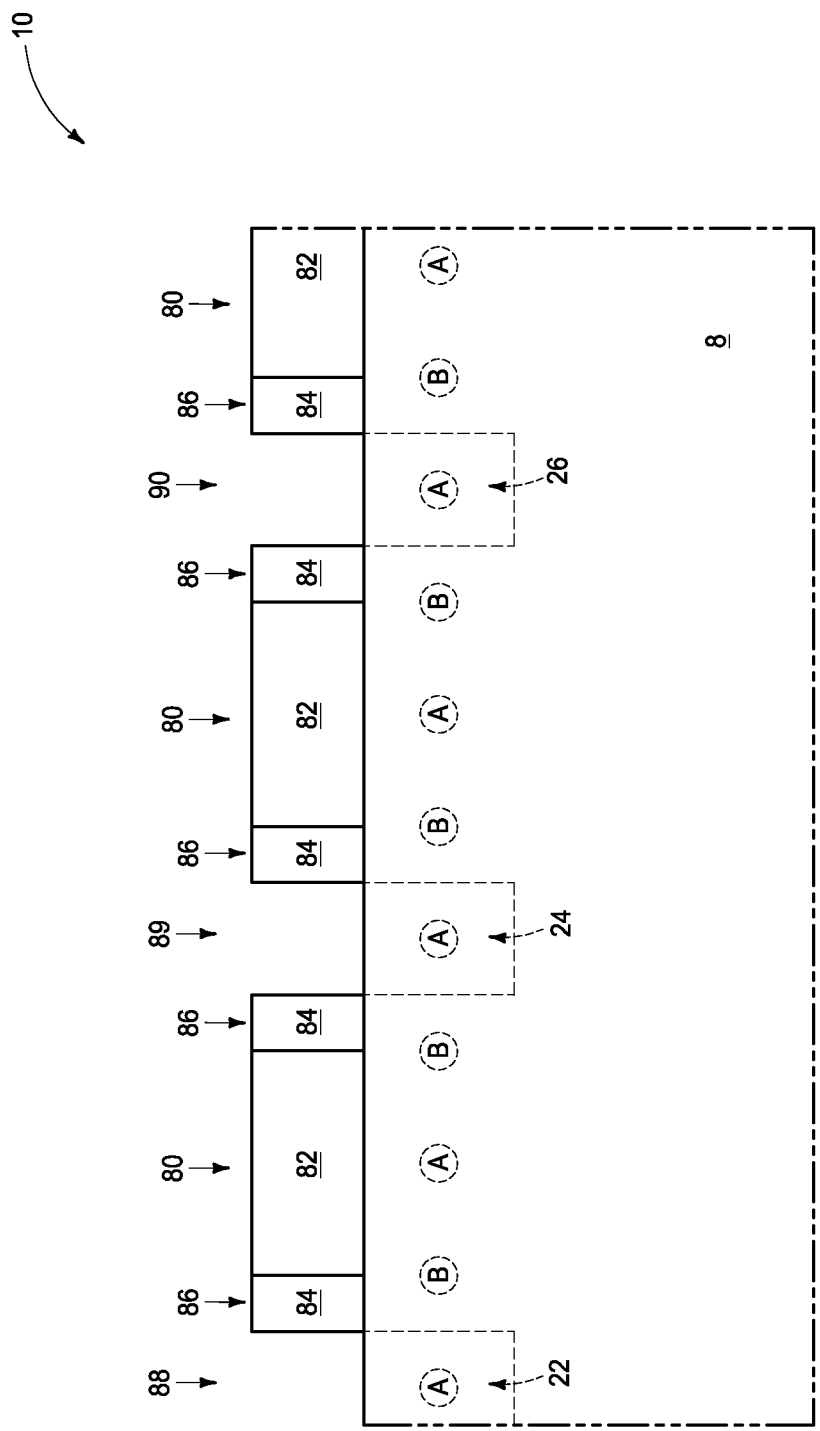

Referring to FIGS. 18 and 19 (with FIG. 19 being a view along the line X-X of FIG. 18), spacer material 84 is formed along the lateral peripheries of islands 80 to form spacers 86. The spacers along adjacent islands 80 interconnect to form a patterned mask which defines trenches 88-90 which serpentine curvilinearly along the second direction of axis 7.

FIG. 19 shows that the trenches 88-90 extend to an upper surface of semiconductor substrate 8. Locations for the patterned structures 22, 24 and 26 are defined at bases of the trenches 88-90 (with such locations being diagrammatically illustrated utilizing dashed lines).

Figure 20:
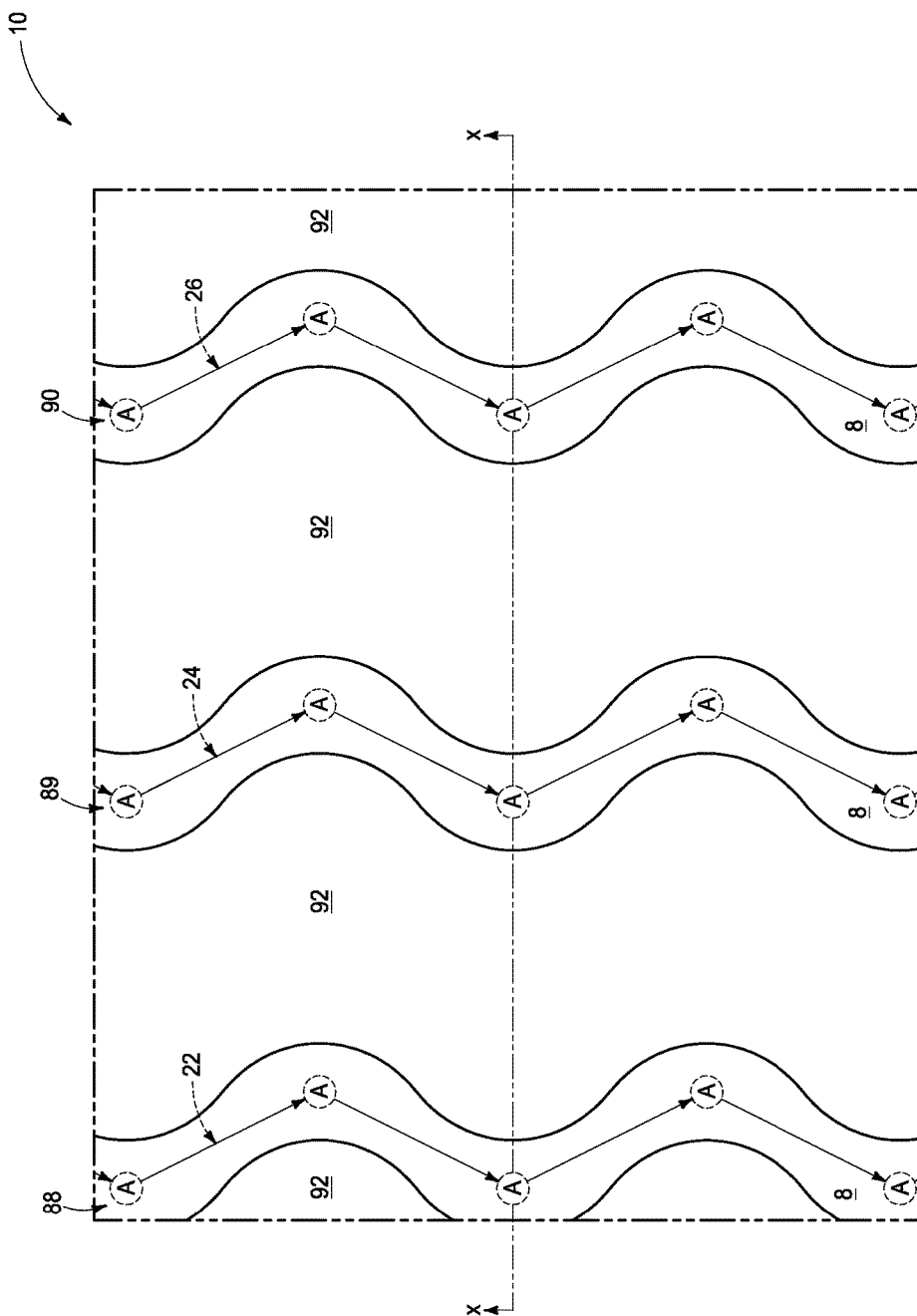
Figure 21:
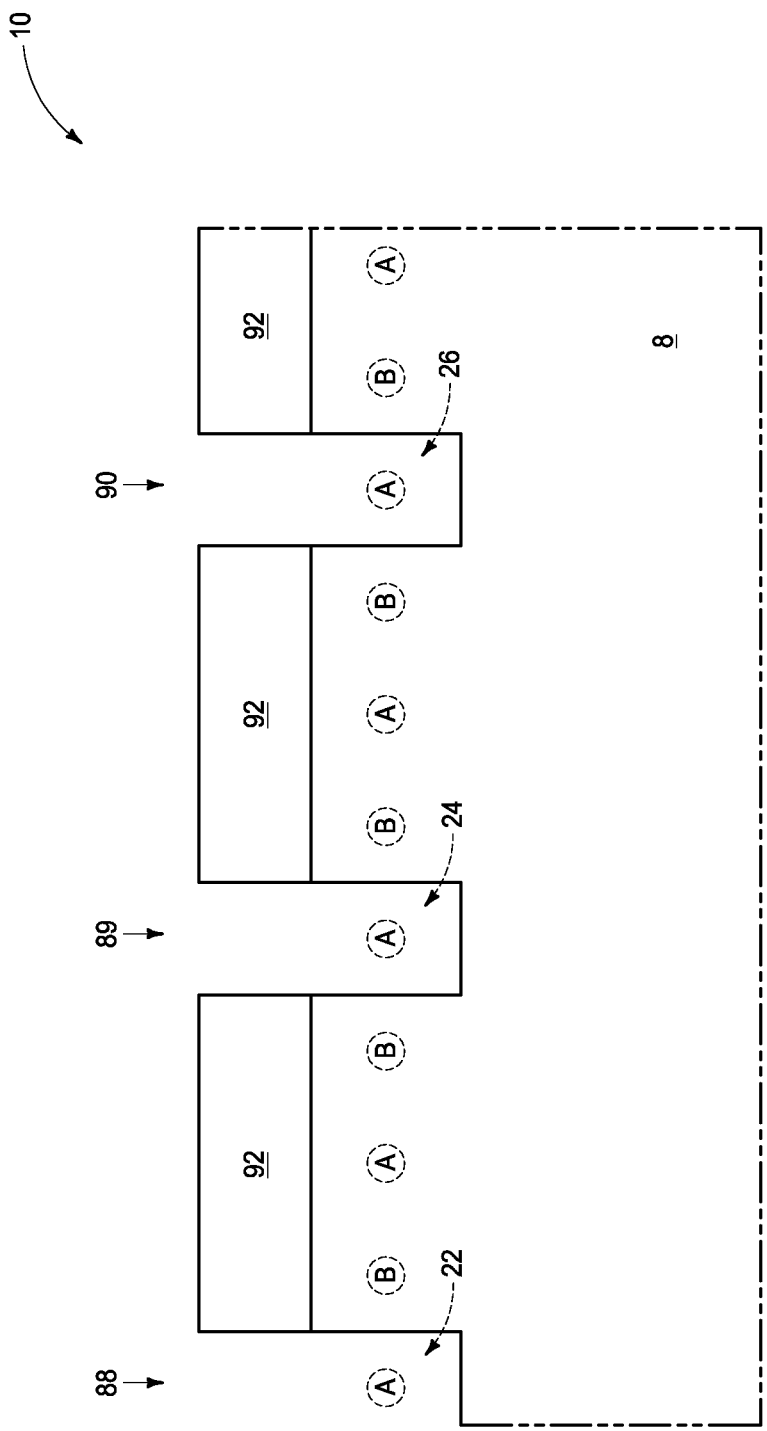

Referring to FIGS. 20 and 21 (with FIG. 21 being a view along the line X-X of FIG. 20), the materials 82 and 84 (FIGS. 18 and 19) may be together considered to define masking material 92 patterned to have the trenches 88-90 extending therethrough. The trenches 88-90 are extended into semiconductor substrate 8 in the locations where patterned structures 22, 24 and 26 are to be formed. (In other embodiments, the trenches may not be extended into the substrate, but may instead be utilized to pattern a dopant implant, to pattern conductive material in a damascene process, etc.)

Figure 22:
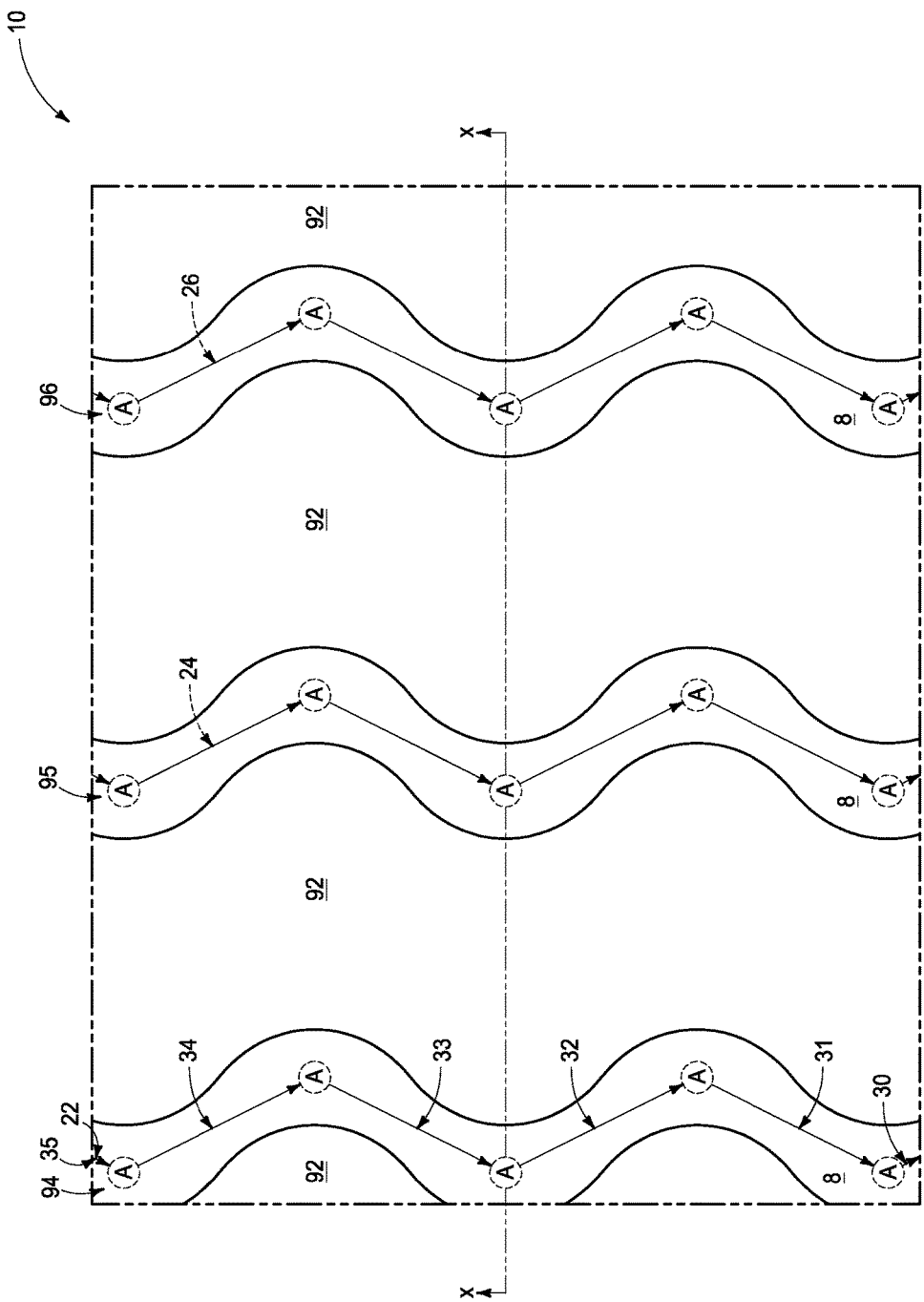
Figure 23:
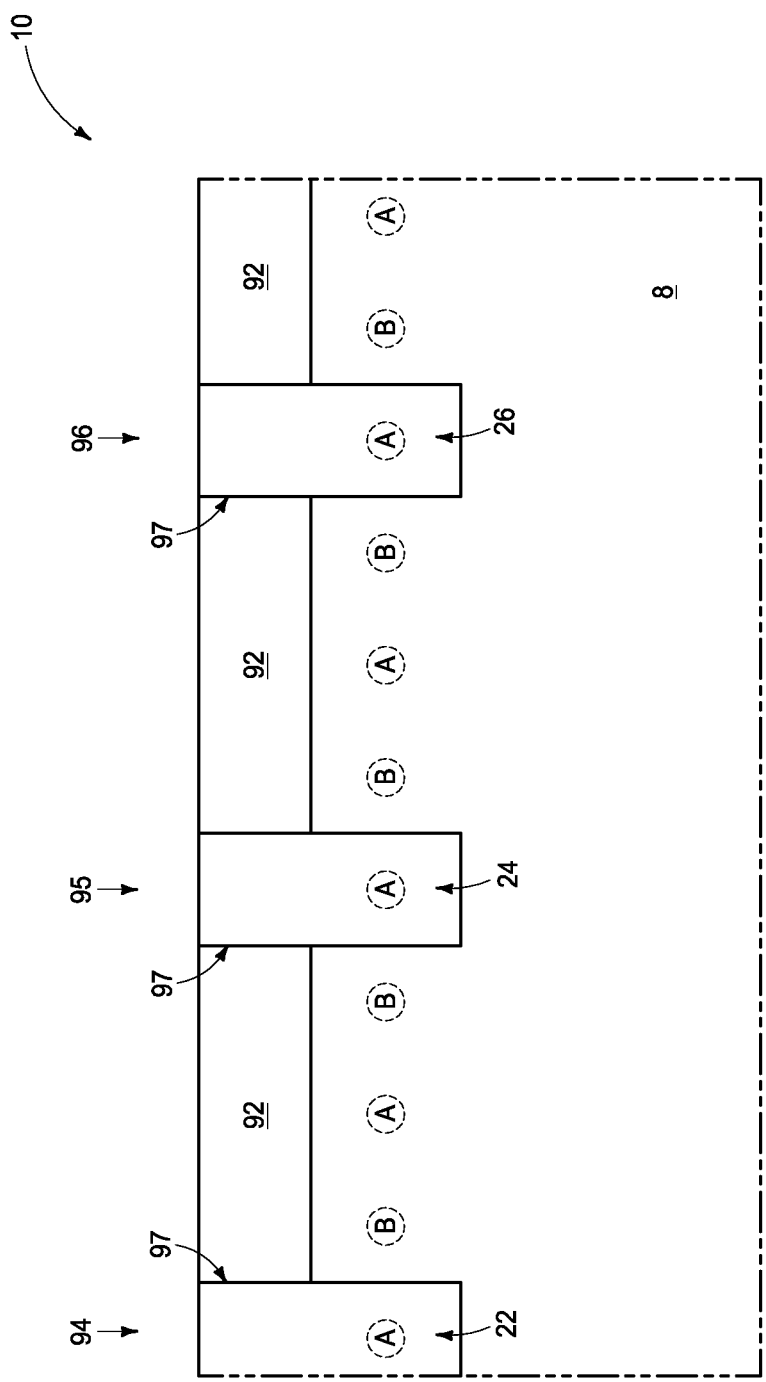

Referring to FIGS. 22 and 23 (with FIG. 23 being a view along the line X-X of FIG. 22), patterned structures 94-96 are formed within the trenches 88-90 (FIGS. 20 and 21). The patterned structures 94-96 may correspond to the structures 22-24 in some embodiments. The patterned structures 94-96 may comprise sacrificial material in the illustrated embodiment. Such sacrificial material may be any suitable material; and in some embodiments may comprise silicon dioxide, silicon nitride, etc.

The structures 94-96 comprise projections 97 extending above an upper surface of semiconductor substrate 8.

In some embodiments the patterned structures 94-96 may be considered to comprise the segments 30-35 described above with reference to FIG. 4. Such segments may be considered to comprise the first set extending along axis 9 (i.e., segments 30, 32 and 34), and the second set extending along axis 11 (segments 31, 33 and 35). All of the segments 30-35 are simultaneously formed in the embodiment of FIGS. 17-22. In other words, the pattern utilized to form the first set of segments (30, 32 and 34) and the pattern utilized to form the second set of segments (31, 33 and 35) are provided simultaneously in the embodiment of FIGS. 17-22 (and specifically are provided as trenches 88-90); in contrast to the above-described embodiment of FIGS. 5-16 in which the pattern utilized to form the segments 31, 33 and 35 is provided at a processing stage of FIGS. 7-9, and the pattern utilized to form the segments 30, 32 and 34 is provided at the different processing stage of FIGS. 10-12.

Figure 24:
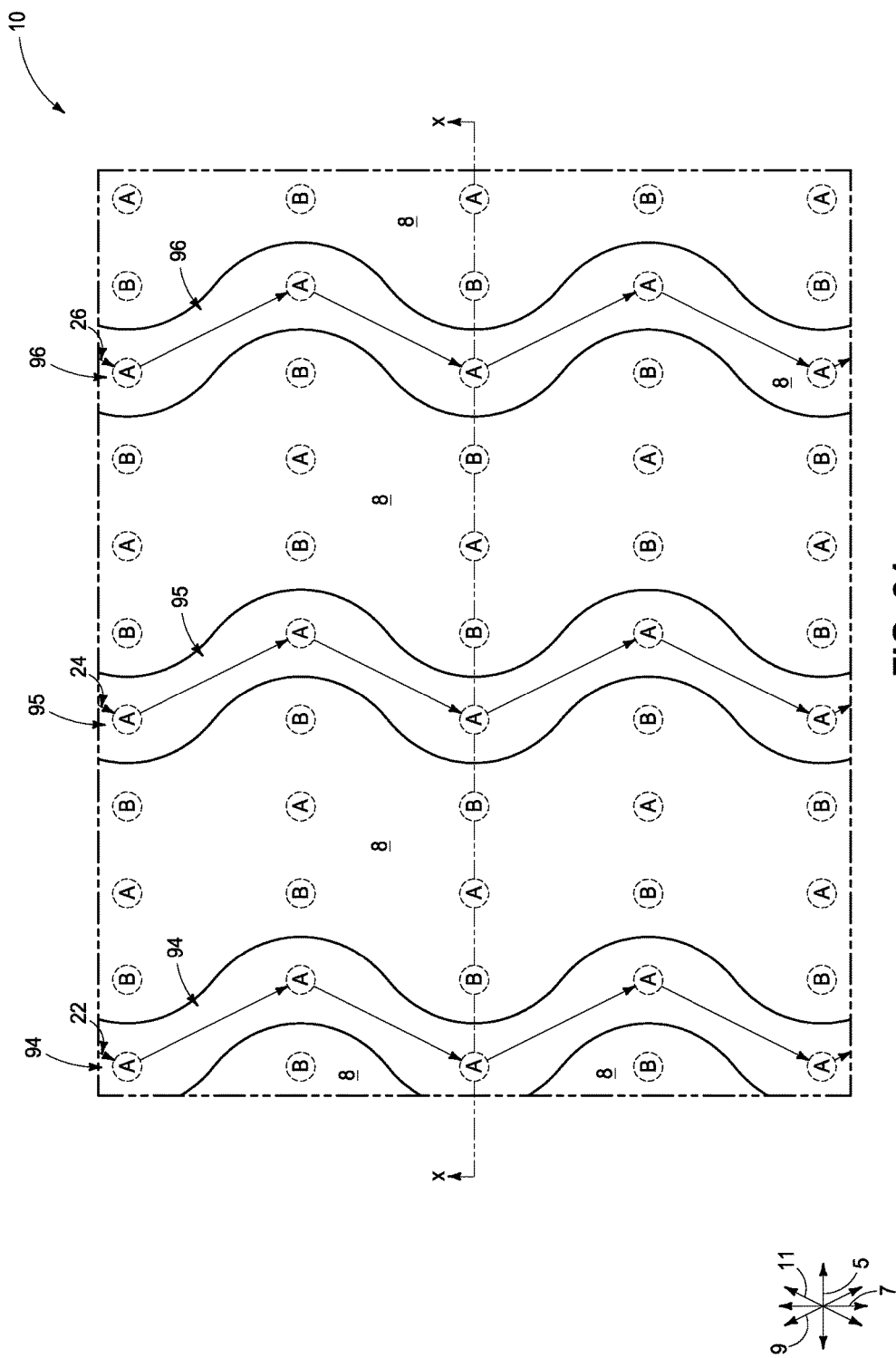
Figure 25:
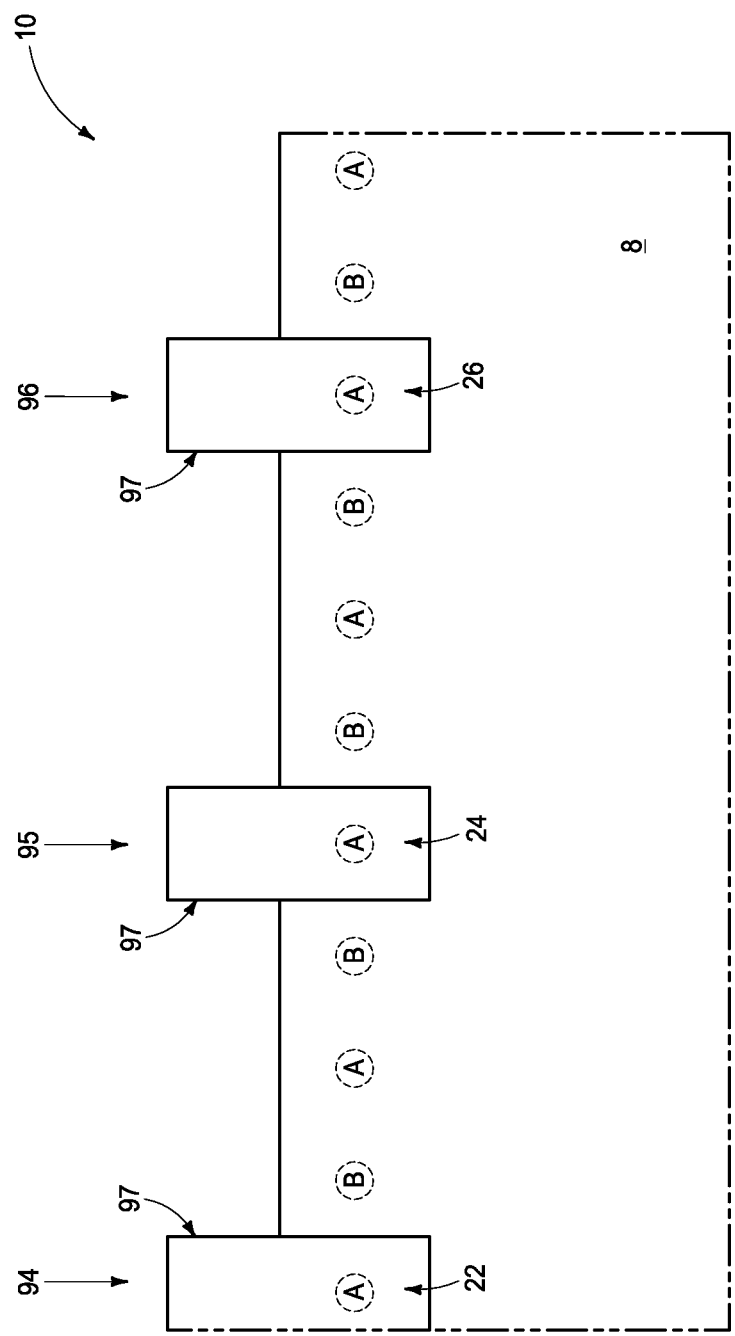

Referring to FIGS. 24 and 25 (with FIG. 25 being a view along the line X-X of FIG. 24), masking material 92 (FIGS. 22 and 23) is removed.

Figure 27:
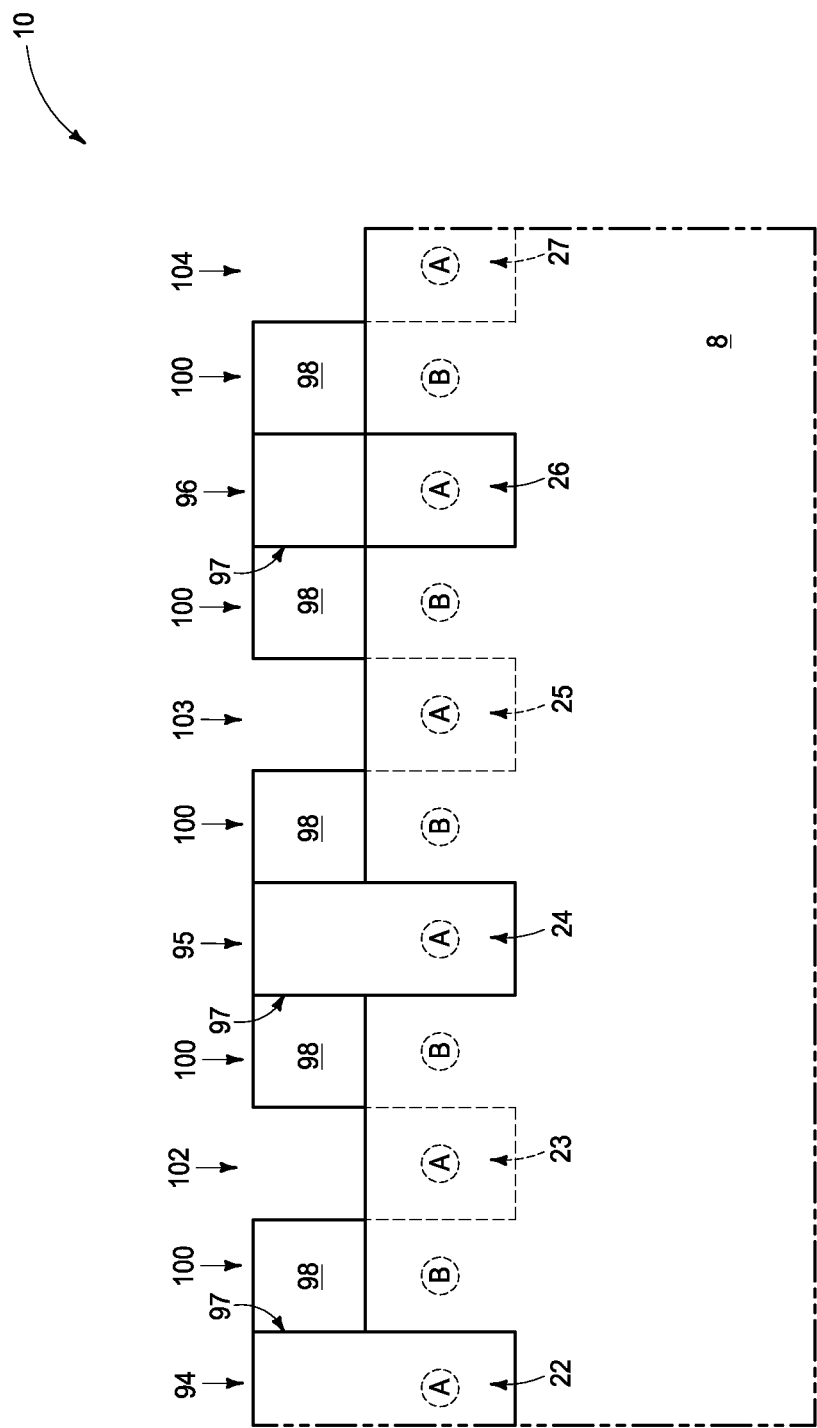

Referring to FIGS. 26 and 27 (with FIG. 27 being a view along the line X-X of FIG. 26), spacer material 98 is formed along the projections 97 of structures 94-96 to form spacers 100. In some embodiments, the spacers 86 of FIGS. 18 and 19 may be referred to as first spacers, and the spacers 100 of FIGS. 26 and 27 may be referred to as second spacers.

The spacer material 98 may comprise any suitable composition or combination of compositions; including, for example, one or more of silicon dioxide, silicon nitride, etc.

The spacers 100 are aligned with the patterned structures 94-96 and define trenches 102-104 which serpentine curvilinearly along the second direction of axis 7. The trenches 102-104 may be referred to as second trenches to distinguish them from the first trenches 88-90 of FIGS. 18 and 19. The second trenches 102-104 duplicate the first trenches 80-90, and alternate with the first trenches along the direction of axis 5.

The trenches 102-104 define locations for patterned structures 23, 25 and 27; with such locations being diagrammatically illustrated in FIG. 27 utilizing dashed lines.

Figure 29:
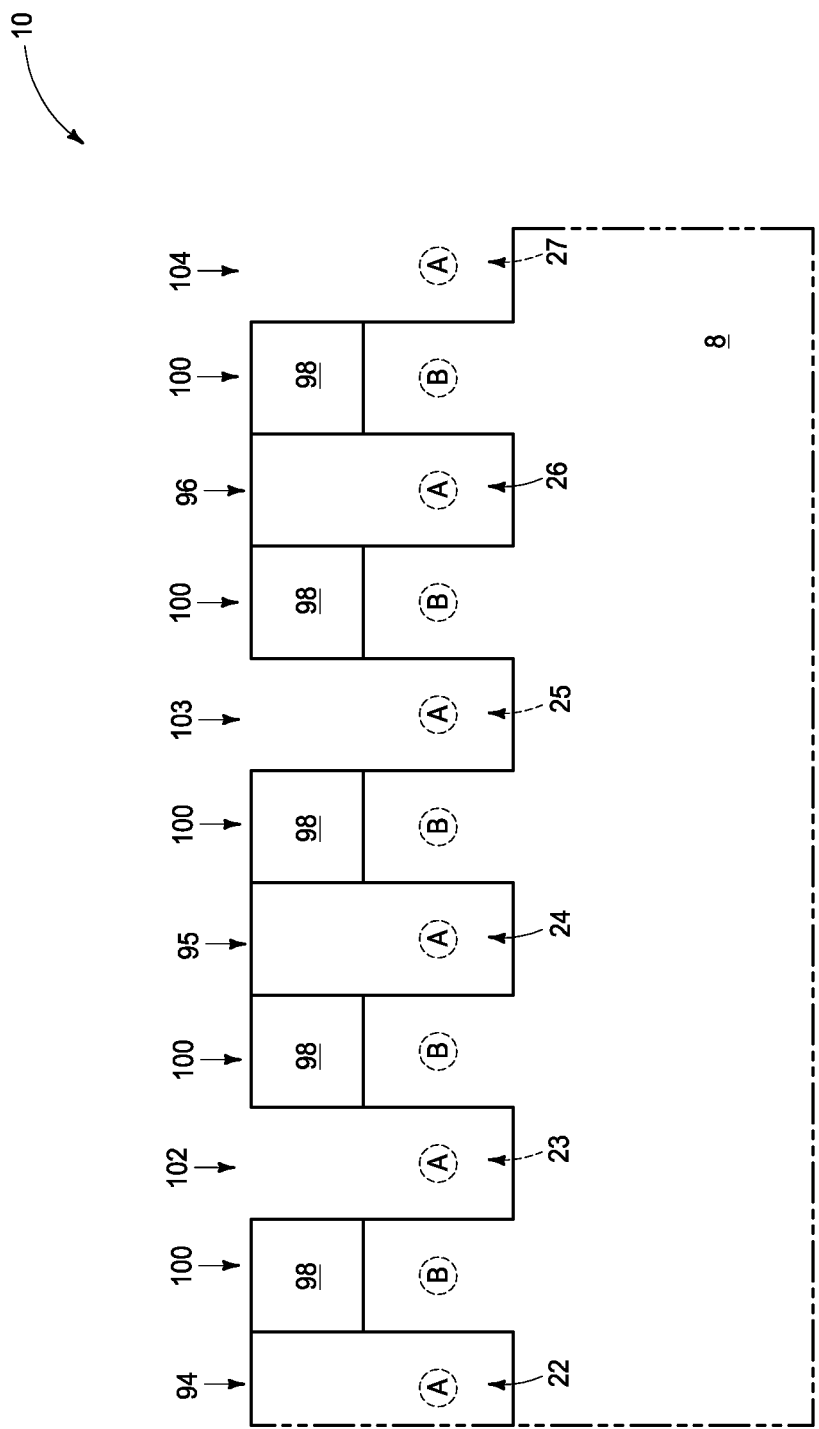

Referring to FIGS. 28 and 29 (with FIG. 29 being a view along the line X-X of FIG. 28), the trenches 102-104 are extended into semiconductor substrate 8 in the locations where patterned structures 23, 25 and 27 are to be formed.

Figure 30:
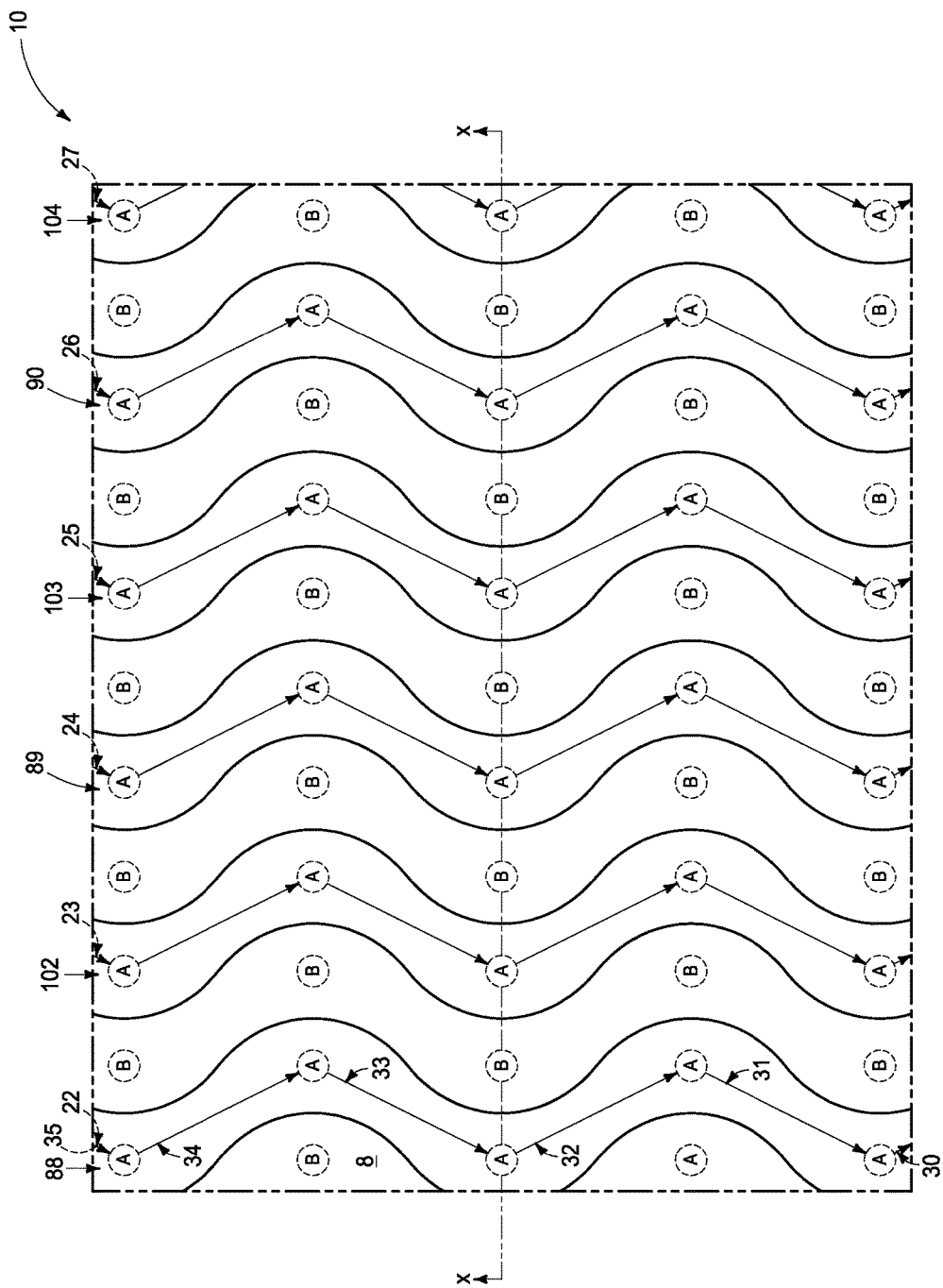
Figure 31:
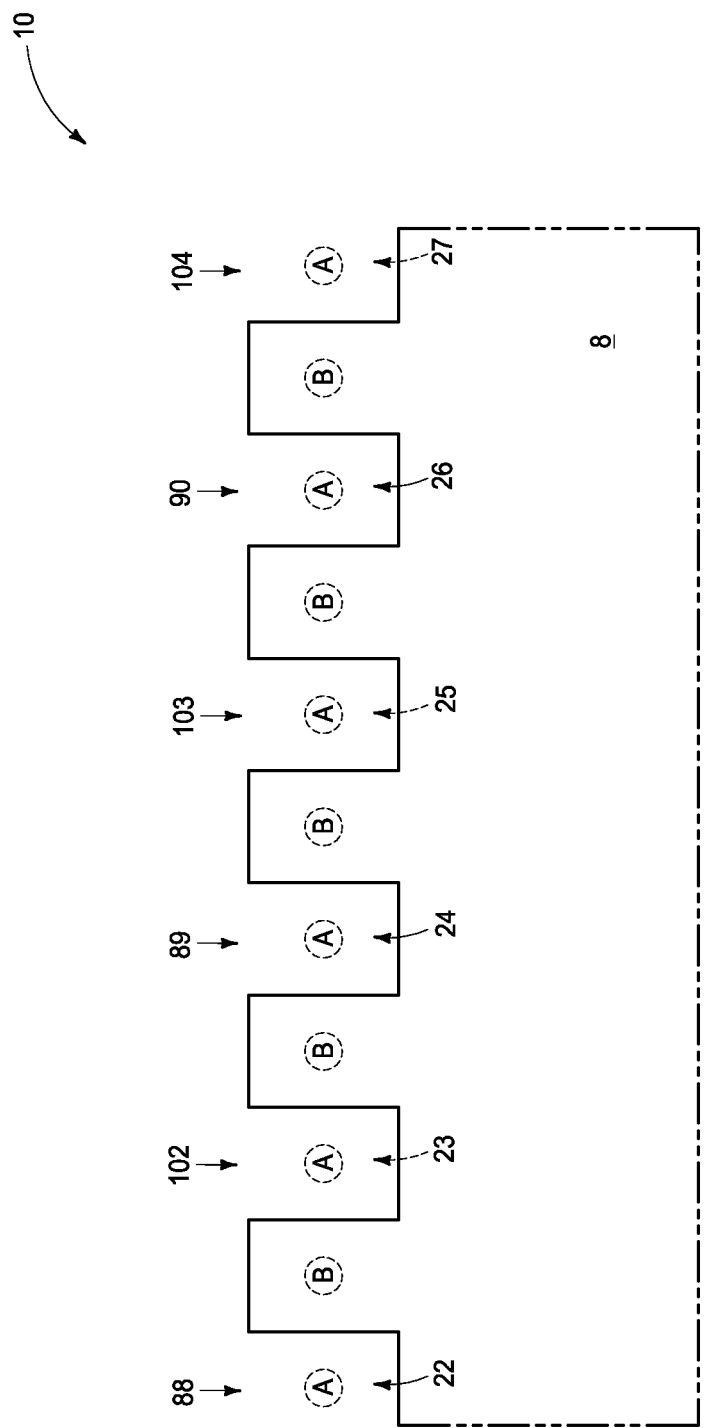

Referring to FIGS. 30 and 31 (with FIG. 31 being a view along the line X-X of FIG. 30), patterned structures 94-96 (FIGS. 28 and 29) and spacer material 98 (FIGS. 28 and 29) are removed to leave trenches 88, 102, 89, 103, 90 and 104 defining locations where patterned structures 22-27 are to be formed. It is noted that the structures 94-96 of FIGS. 28 and 29 were temporary patterned structures formed within the first trenches 88-90 in order to align the second trenches 102-104 with the first trenches. In some embodiments such temporary patterned structures may be referred to as first patterned structures.

The patterned structures 22-27 comprise the first set of segments extending along axis 9 (i.e., segments 30, 32 and 34), and the second set of segments extending along axis 11 (segments 31, 33 and 35). All of the segments 30-35 are defined by the patterned trenches 88, 102, 89, 103, 90 and 104 of FIGS. 30 and 31.

The trenches 88, 102, 89, 103, 90 and 104 define locations for patterned structures 22-27. Such patterned structures will serpentine curvilinearly across semiconductor substrate 8 in the same manner in which the trenches 88, 102, 89, 103, 90 and 104 serpentine across the substrate.

Figure 33:
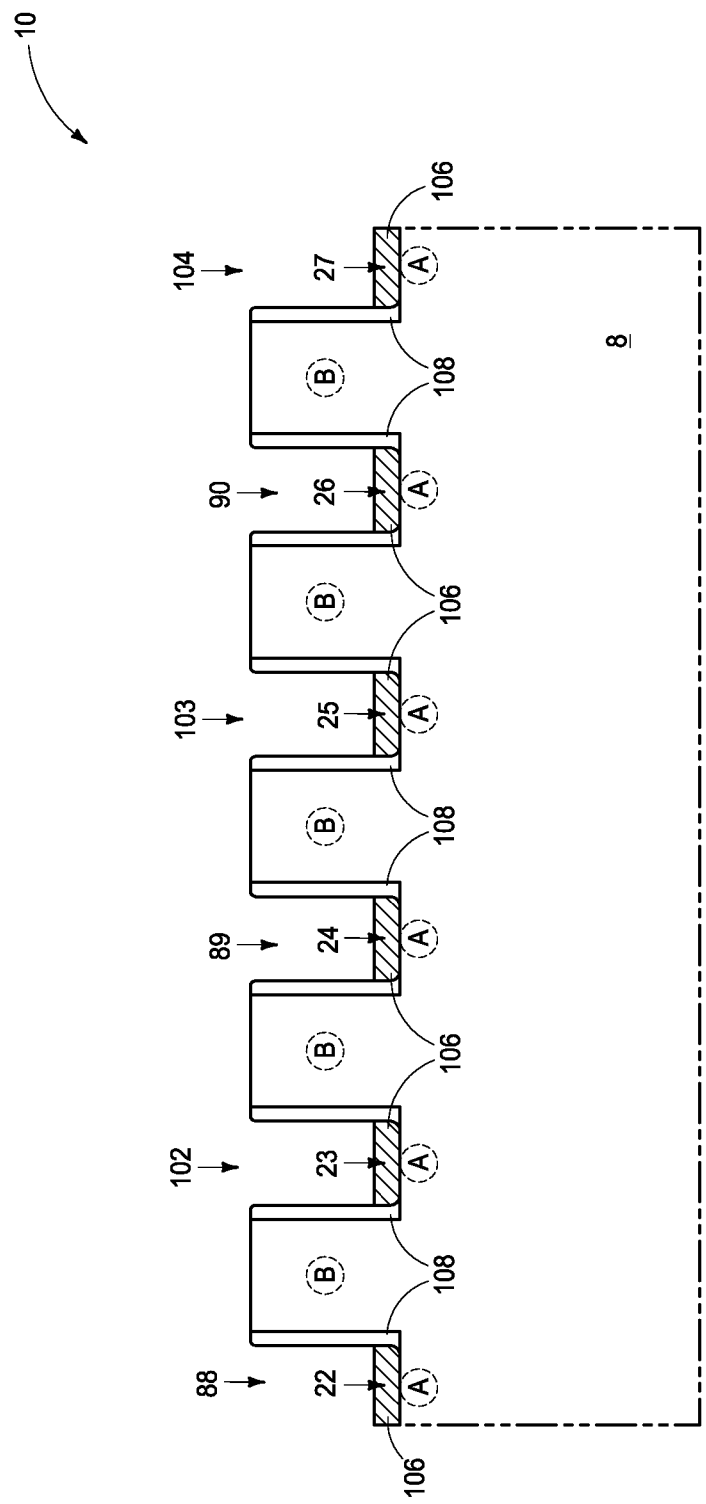
Figure 34:
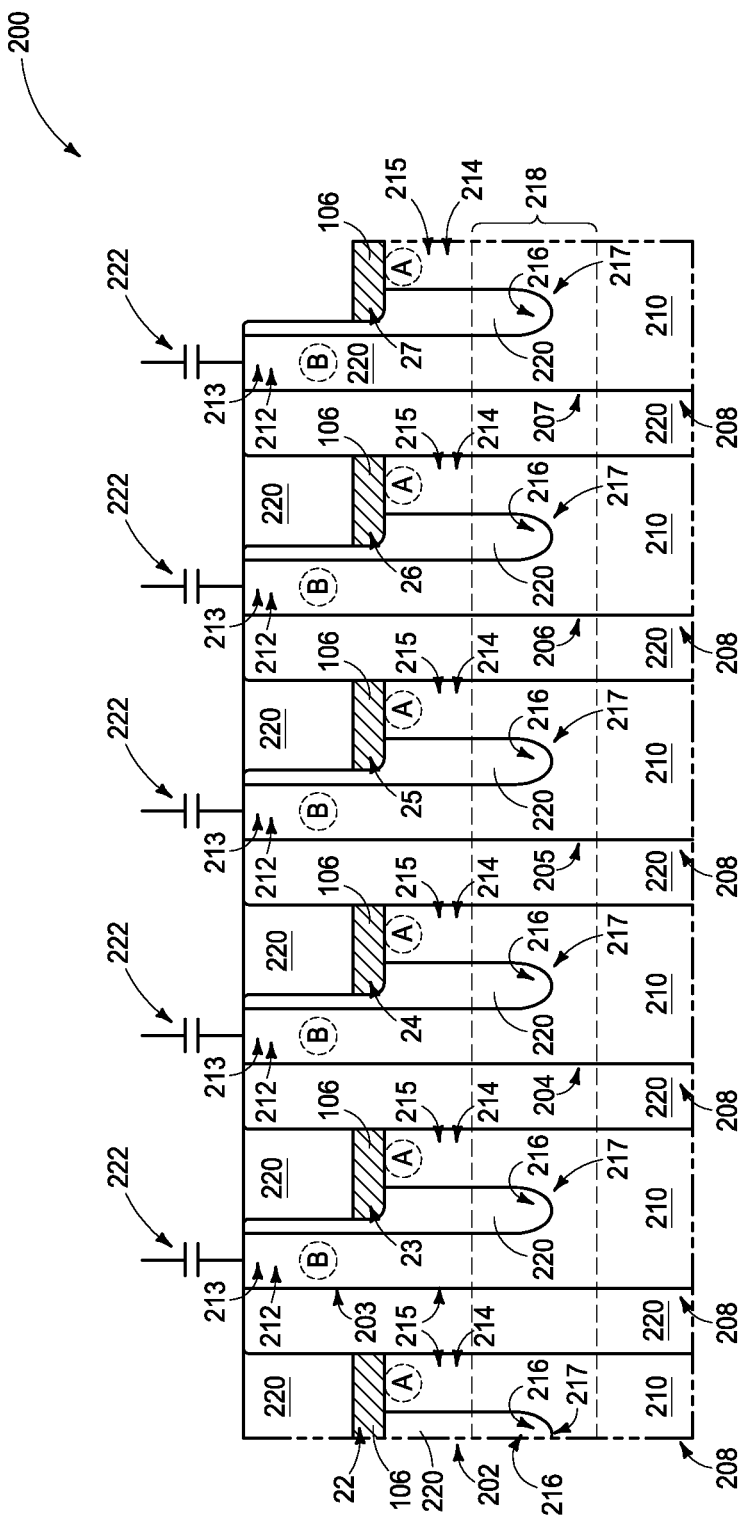
FIG. 34 is a diagrammatic cross-sectional side view showing example integrated structures that may be formed with the processing of FIGS. 5-33.

Referring to FIGS. 32 and 33 (with FIG. 33 being a view along the line X-X of FIG. 32) example conductive structures 22-27 are formed within trenches 88, 102, 89, 103, 90 and 104. In the illustrated embodiment the conductive structures comprise conductive material 106. Such conductive material may be any suitable conductive material, including, for example, one or more of conductively-doped semiconductor material, metal, and metal-containing compositions. The conductive material 106 is shown to be spaced from semiconductor substrate 8 by insulative material 108. Such insulative material may comprise any suitable composition or combination of compositions; including, for example, one or both of silicon dioxide and silicon nitride. In some embodiments the upper region of semiconductor substrate 8 is electrically insulative, and accordingly the insulative material 108 may be omitted. In some embodiments semiconductor substrate 8 comprises semiconductor material exposed at the bottoms of trenches 88, 102, 89, 103, 90 and 104; and conductive regions 106 correspond to conductively-doped regions of the semiconductor material.

In the embodiment of FIGS. 17-32 the patterned structures 94-96 (FIGS. 22 and 23) are temporary structures utilized to align the second trenches 102-104 (FIGS. 26 and 27) with the first trenches 88-90 (FIGS. 18 and 19). In some embodiments the second trenches 102-104 are formed with identical processing as is utilized to form the first trenches 88-90 (i.e., islands and spacers analogous to the islands 80 and spacers 86 of FIG. 18), and after formation of the first trenches 88-90. In such embodiments the temporary patterned structures 94-96 may be omitted and instead replaced with conductive structures (e.g., structures comprising conductive material 106).

The structures 22-27 may correspond to digit lines in the illustrated embodiment. In other embodiments the structures 22-27 may correspond to other integrated circuitry in addition to, or alternatively to, digit lines.

The structures 22-27 of FIG. 33 are generically illustrated, and may be utilized in any suitable application. For instance, the structures 22-27 may correspond to digit lines, and may be utilized in DRAM arrays, in arrays comprising ferroelectric memory, etc. A specific example of a memory array configuration is described with reference to a memory array 200 in FIG. 34.

The memory array 200 comprises fin field effect transistors (finFETs) 202-207, with each finFET including a fin 208 of semiconductor material 210. The fins include pedestals 212 and 214, with such pedestals joining through a trough 216. Each of the pedestals 212 and 214 may comprise source/drain regions 213 and 215, respectively. A channel region 217 extends around the trough 216 and between the source/drain regions 213 and 215. A wordline 218 is diagrammatically illustrated with dashed-lines, as the wordline is out of the plane of the view of FIG. 34 (and specifically is in front of such plane). The wordline may comprise gates of the finFETs 202-207, with such gates being spaced from the semiconductor material 210 by gate dielectric (not shown). In operation, the gates control current flow along the channel regions 217.

The fins 208 are spaced from one another by dielectric material 220. In the shown embodiment the dielectric material 220 also extends within the troughs 216.

Capacitors 222 are electrically coupled with the source/drain regions 213, and the structures 22-27 are digit lines electrically coupled with the source/drain regions 215. The capacitors 222 may be non-ferroelectric and/or may be ferroelectric capacitors.

The capacitors 222, digit lines (structures 22-27) and finFETs 202-207 are together incorporated into the memory array 200, with such memory array having memory cells which store data as a charge state of the capacitors.

Structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a pattern. A semiconductor substrate is provided to have rows extending along a first direction. The rows are spaced from one another along a second direction. Each of the rows includes course regions that are to be included along patterned structures which extend generally along the second direction. The rows are subdivided amongst first and second rows which alternate with one another along the second direction. The course regions within the first rows are staggered relative to the course regions within the second rows. The patterned structures comprise first segments which extend along a third direction intermediate the first and second directions, and comprise second segments which extend along a fourth direction intermediate the first and second directions and which is different from the third direction. Patterned masking material is formed across the semiconductor substrate to define a first pattern comprising the first segments of the patterned structures, and to define a second pattern comprising the second segments of the patterned structures. The patterned structures are formed within the first and second patterns defined by the patterned masking material.

Some embodiments include a method of forming a pattern. A semiconductor substrate is provided to have rows extending along a first direction. The rows are spaced from one another along a second direction. Each row comprises course regions that are to be included along patterned structures extending generally along the second direction. The rows are subdivided amongst first and second rows which alternate with one another along the second direction. The course regions within the first rows are staggered relative to the course regions within the second rows. Islands of masking material are formed over alternating course regions along the rows. Spacers are formed along lateral peripheries of the islands. The spacers along adjacent islands interconnect to form a patterned mask which defines trenches that serpentine curvilinearly along the second direction. The patterned structures are formed within the trenches.

Some embodiments include a method of forming a pattern. A semiconductor substrate is provided to have rows extending along a first direction. The rows are spaced from one another along a second direction. Each row comprises alternating first regions and second regions. The first regions are course regions that are to be included along patterned structures extending generally along the second direction. The rows are subdivided amongst first and second rows which alternate with one another along the second direction. The course regions within the first rows are staggered relative to the course regions within the second rows. Blocking material segments are formed along the rows. The blocking material segments are across every other space between first and second regions along the rows. A first patterned mask is formed across the semiconductor substrate and the blocking material segments. The first patterned mask defines a plurality of substantially linear first trenches which extend along a third direction intermediate the first and second directions. First segments of the patterned structures are formed within the first trenches. A second patterned mask is formed across the semiconductor substrate, across the blocking material segments, and across the first segments of the patterned structures. The second pattern patterned mask defines a plurality of substantially linear second trenches which extend along a fourth direction intermediate the first and second directions, and which is different from the third direction. Second segments of the patterned structures are formed within the second trenches. The first and second segments of the patterned structures connect with one another to form the patterned structures. Each of the patterned structures extends in a zigzag manner across the first and rows along the second direction.

Some embodiments include an apparatus comprising a plurality of finFETs arranged in line in a first direction and a digit line formed in a zigzag pattern. Each of the plurality of finFETs comprises a first pedestal serving as a first source/drain region, a second pedestal serving as a second source/drain region and a trough defining a channel region between the first and second source/drain regions. The first and second source/drain regions of each of the plurality of finFETs are disposed in line in a second direction that is substantially perpendicular to the first direction. An arrangement in the second direction of the first and second source/drain region of each of even-numbered ones of the plurality of finFETs is reverse to an arrangement in the second direction of the first and second source/drain regions of each of odd-numbered ones of the plurality of finFETs such that the first source/drain region of each of the even-numbered ones of the plurality of finFETs is sandwiched in the first direction between the second source/drain regions of corresponding adjacent two of odd-numbered ones of the plurality of finFETs. The digit line is formed in a zigzag pattern to electrically interconnect the first source/drain regions of the plurality of finFETs to each other.

Some embodiments include an apparatus comprising a plurality of finFETs arranged in matrix including a plurality of rows and a plurality of columns and a plurality of digit lines. Each of the plurality of finFETs comprises a first pedestal serving as a first source/drain region, a second pedestal serving as a second source/drain region and a trough defining a channel region between the first and second source/drain regions. The first and second source/drain regions of each of the plurality of finFETs are disposed in a row direction. Each of even-numbered ones of the plurality of rows are shifted in a row direction with respect to each of odd-numbered ones of the plurality of rows such that the first source/drain region of each of the plurality of finFETs belonging to each of the even-numbered ones of the plurality of rows is sandwiched in a column direction between the second source/drain regions of corresponding adjacent two of the plurality of finFETs belonging to each of the odd-numbered ones of the plurality of rows. Each of the plurality of digit lines is formed in a zigzag pattern to electrically interconnect the first source/drain regions of the plurality of finFETs belonging to a corresponding one of the plurality of columns.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a pattern, comprising:
    providing a semiconductor substrate having rows extending along a first direction; the rows being spaced from one another along a second direction; each row comprising course regions that are to be included along patterned structures extending generally along the second direction; the rows being subdivided amongst first and second rows which alternate with one another along the second direction; the course regions within the first rows being staggered relative to the course regions within the second rows; the patterned structures comprising first segments extending along a third direction intermediate the first and second directions, and comprising second segments extending along a fourth direction intermediate the first and second directions and different from the third direction;
    forming patterned masking material across the semiconductor substrate to define a first pattern comprising the first segments of the patterned structures, and to define a second pattern comprising the second segments of the patterned structures; and
    forming the patterned structures within the first and second patterns defined by the patterned masking material.

2. The method of claim 1 wherein the first pattern is formed sequentially relative to the second pattern; and wherein the first segments of the patterned structures are formed within the first pattern prior to forming the second pattern.

3. The method of claim 2 wherein the first pattern is formed to comprise a plurality of substantially linear first trenches extending along the third direction; and wherein the second pattern is formed to comprise a plurality of substantially linear second trenches extending along the fourth direction; with the second trenches passing across the first trenches.

4. The method of claim 1 wherein the first and second patterns are formed simultaneously.

5. The method of claim 4 wherein the first and second patterns together form trenches that serpentine in a curvilinear manner along the second direction.

6. The method of claim 5 wherein the forming of the patterned masking material comprises:
    forming substantially circular features over the semiconductor substrate; and
    forming spacers along lateral peripheries of the substantially circular features to create the trenches.

7. A method of forming a pattern, comprising:
    providing a semiconductor substrate having rows extending along a first direction; the rows being spaced from one another along a second direction; each row comprising course regions that are to be included along patterned structures extending generally along the second direction; the rows being subdivided amongst first and second rows which alternate with one another along the second direction; the course regions within the first rows being staggered relative to the course regions within the second rows;
    forming islands of masking material over alternating course regions along the first and second rows;
    forming spacers along lateral peripheries of the islands; the spacers along adjacent islands interconnecting to form a patterned mask which defines trenches that serpentine curvilinearly along the second direction; and
    forming the patterned structures within the trenches.

8. The method of claim 7 wherein the patterned structures are first patterned structures and comprise projections extending above an upper surface of the semiconductor substrate, wherein the trenches are first trenches, and wherein the spacers are first spacers; the method comprising
    forming second spacers aligned with the first patterned structures and defining second trenches which duplicate the first trenches and alternate with the first trenches along the first direction;
    removing the first patterned structures to open the first trenches; and
    forming second patterned structures within the first and second trenches.

9. The method of claim 8 wherein the second patterned structures are conductive lines extending curvilinearly along the second direction.

10. A method of forming a pattern, comprising:
    providing a semiconductor substrate having rows extending along a first direction; the rows being spaced from one another along a second direction; each row comprising alternating first regions and second regions; the first regions being course regions that are to be included along patterned structures extending generally along the second direction; the rows being subdivided amongst first and second rows which alternate with one another along the second direction; the course regions within the first rows being staggered relative to the course regions within the second rows;
    forming blocking material segments that cover every other space between the first and second regions along the first and second rows;
    forming a first patterned mask across the semiconductor substrate and the blocking material segments; the first patterned mask defining a plurality of substantially linear first trenches extending along a third direction intermediate the first and second directions;
    forming first segments of the patterned structures within the first trenches;
    forming a second patterned mask across the semiconductor substrate, across the blocking material segments, and across the first segments of the patterned structures; the second pattern patterned mask defining a plurality of substantially linear second trenches extending along a fourth direction intermediate the first and second directions and different from the third direction; and
    forming second segments of the patterned structures within the second trenches; the first and second segments of the patterned structures connecting with one another to form the patterned structures; each of said patterned structures extending in a zigzag manner across the first and rows along the second direction.

11. The method of claim 10 wherein the first and second segments of the patterned structures comprise conductive material, and wherein the patterned structures are conductive lines.

12. The method of claim 11 wherein the semiconductor substrate comprises silicon, and wherein the conductive material includes conductively-doped regions within the silicon.

13. An apparatus, comprising:
a plurality of finFETs arranged in line in a first direction, wherein each of the plurality of finFETs comprises a first pedestal serving as a first source/drain region, a second pedestal serving as a second source/drain region and a trough defining a channel region between the first and second source/drain regions, wherein the first and second source/drain regions of each of the plurality of finFETs are disposed in line in a second direction that is substantially perpendicular to the first direction, wherein an arrangement in the second direction of the first and second source/drain region of each of even-numbered ones of the plurality of finFETs is reverse to an arrangement in the second direction of the first and second source/drain regions of each of odd-numbered ones of the plurality of finFETs such that the first source/drain region of each of the even-numbered ones of the plurality of finFETs is sandwiched in the first direction between the second source/drain regions of corresponding adjacent two of the odd-numbered ones of the plurality of finFETs; and
a digit line formed in a zigzag pattern to electrically interconnect the first source/drain regions of the plurality of finFETs to each other.

14. The apparatus according to claim 13, further comprising:
a plurality of data storage units, wherein each of the plurality of data storage units is electrically connect to an associated one of the second source/drain regions of the plurality of finFETs.

15. The apparatus according to claim 13, wherein the second pedestal of each of the plurality of finFETs is greater in height than the first pedestal of each of the plurality of finFETs.

16. The apparatus according to claim 15, further comprising a plurality of wordlines, wherein each of the plurality of wordlines is formed in the second direction between corresponding adjacent two of the plurality of finFETs to overlap the channel region of at least one of the corresponding two of the plurality of finFETs with an intervention of a gate dielectric.

17. The apparatus according to claim 16, wherein the digit line crosses over each of the plurality of wordlines separately therefrom.

18. An apparatus, comprising:
a plurality of finFETs arranged in matrix including a plurality of rows and a plurality of columns, wherein each of the plurality of finFETs comprises a first pedestal serving as a first source/drain region, a second pedestal serving as a second source/drain region and a trough defining a channel region between the first and second source/drain regions, wherein the first and second source/drain regions of each of the plurality of finFETs are disposed in a row direction, wherein each of even-numbered ones of the plurality of rows is shifted in a row direction with respect to each of odd-numbered ones of the plurality of rows such that the first source/drain region of each of the finFETs belonging to an associated one of the even-numbered ones of the plurality of rows is sandwiched in a column direction between the second source/drain regions of adjacent two of the finFETs belonging to associated adjacent two of the odd-numbered ones of the plurality of rows; and
a plurality of digit lines, wherein each of the plurality of digit lines is formed in a zigzag pattern to electrically interconnect the first source/drain regions of the plurality of finFETs belonging to a corresponding one of the plurality of columns.

19. The apparatus according to claim 18, further comprising a plurality of wordlines, wherein each of the plurality of wordlines is formed in the row direction between corresponding adjacent two of the plurality of rows to overlap the channel regions of the finFETs belonging to at least one of the corresponding adjacent two of the plurality of rows with an intervention of a gate dielectric.

20. The apparatus according to claim 19, wherein each of the plurality of digit lines crosses over each of the plurality of wordlines separately therefrom.

* * * * *